US010856410B2

(12) United States Patent
Iso-Ketola et al.

(10) Patent No.: US 10,856,410 B2
(45) Date of Patent: Dec. 1, 2020

(54) STRETCHABLE STRUCTURE COMPRISING A CONDUCTIVE PATH AND A METHOD FOR MANUFACTURING THE STRUCTURE

(71) Applicant: Tampere University Foundation sr, University of Tampere (FI)

(72) Inventors: Pekka Iso-Ketola, Sastamala (FI); Jukka Vanhala, Pirkkala (FI); Matti Mäntysalo, Lempäälä (FI)

(73) Assignee: Tampere University Foundation sr, University of Tampere (FI)

( * ) Notice: Subject to any disclaimer, the term of this patent is extended or adjusted under 35 U.S.C. 154(b) by 0 days.

(21) Appl. No.: 16/336,916

(22) PCT Filed: Sep. 25, 2017

(86) PCT No.: PCT/FI2017/050670
§ 371 (c)(1),
(2) Date: Mar. 27, 2019

(87) PCT Pub. No.: WO2018/060554
PCT Pub. Date: Apr. 5, 2018

(65) Prior Publication Data
US 2019/0394875 A1 Dec. 26, 2019

(30) Foreign Application Priority Data
Sep. 27, 2016 (FI) ..................... 20165724

(51) Int. Cl.
*H01B 17/00* (2006.01)
*H05K 1/02* (2006.01)
(Continued)

(52) U.S. Cl.
CPC ........... *H05K 1/0283* (2013.01); *H05K 1/038* (2013.01); *H05K 3/4685* (2013.01); *H05K 2201/2009* (2013.01)

(58) Field of Classification Search
USPC ........................................ 174/110
See application file for complete search history.

(56) References Cited

U.S. PATENT DOCUMENTS

2011/0278729 A1 11/2011 Huang
2013/0256921 A1 10/2013 Huang et al.
(Continued)

FOREIGN PATENT DOCUMENTS

EP 2640168 A1 9/2013
WO 2014205434 A2 12/2014
WO 2015051405 A1 4/2015

OTHER PUBLICATIONS

Finnish Patent and Registration Office, Search Report of Finnish Patent Application No. 20165724, dated Mar. 24, 2017, 1 page.
(Continued)

*Primary Examiner* — Andargie M Aychillhum
(74) *Attorney, Agent, or Firm* — Berggren LLP

(57) ABSTRACT

A stretchable structure comprises or is configured to receive a conductive path and an interface region. The interface region comprises a peripheral line comprising at least one inwardly curved portion, such as an "inverted teardrop" or a fjord like recess pointing essentially towards the center area of the interface region. The interface region is arranged to receive said stretchable conductive path via said inwardly curved portion of said peripheral line of said interface region. In this way the interface region minimizes strains or other twisting or stretching forces directed to the conductor entering into the opening of the inwardly curved portion of the interface region.

29 Claims, 14 Drawing Sheets

(51) Int. Cl.
*H05K 1/03* (2006.01)
*H05K 3/46* (2006.01)

(56) References Cited

U.S. PATENT DOCUMENTS

| | | | |
|---|---|---|---|
| 2014/0022746 A1 | 1/2014 | Hsu | |
| 2014/0144480 A1 | 5/2014 | Lee | |
| 2015/0035680 A1 | 2/2015 | Li et al. | |
| 2015/0189736 A1* | 7/2015 | Yang | H05K 1/028 361/749 |
| 2017/0267441 A1* | 9/2017 | Johnson | B65D 83/06 |

OTHER PUBLICATIONS

Ostmann, Andreas et al., Manufacturing Concepts for Stretchable Electronic Systems, Microsystems, Packaging, Assembly & Circuits Technology Conference, Oct. 22, 2008, pp. 24-27.
European Patent Office, Supplementary European Search Report of EP17855074, dated May 15, 2020, 2 pages.

\* cited by examiner

STRETCHABLE STRUCTURE COMPRISING A CONDUCTIVE PATH AND A METHOD FOR MANUFACTURING THE STRUCTURE

PRIORITY

This application is a U.S national application of the international application number PCT/FI2017/050670 filed on Sep. 25, 2017 and claiming priority of Finnish national application 20165724 filed on Sep. 27, 2016 the contents of all of which are incorporated herein by reference.

TECHNICAL FIELD OF THE INVENTION

The invention relates to a stretchable structure comprising or configured to receive a conductor, advantageously a conductive path and in particularly a stretchable conductive path, and a component, where the component and the conductive path are physically coupled with each other. Especially the invention relates to the stretchable structure having an interface region for receiving and introducing said stretchable conductive path with the component in a manner to prevent any enormous or significant damages induced for the conductive path due to the stretching or twisting of the stretchable structure. In addition the invention relates to a method for manufacturing the stretchable structure.

BACKGROUND OF THE INVENTION

Current conductive materials used in stretchable electronics and structures allow some stretching, e.g. 30% stretching in length. However, when the stretchable conductive materials are used in connection with more rigid components provided on the stretchable structure, forces induced to the entity (e.g. due to stretching or twisting of the structure) are not spread uniformly, which induces some challenges. For example, controlling of the local tensions and forces, especially in an interconnection region near the rigid component and less rigid stretchable electronics and structure, are very challenging task.

One known solution is to use non-stretchable materials, like copper or silicon, in the interconnection region between the stretching non-stretching interface, and the stretchability of the whole system is achieved by providing suitable forms of the conductor and/or substrate structure, such as using meandering patterns, pre-stretching solutions and/or pleated structures.

When there is a joint or a coupling provided with the joint in the stretchable structure, an interface is formed between the stretchable structure and the non-stretchable joint or conductor or other non-stretchable system. Then when the stretchable structure is stretched or twisted in any direction, the structure is stressed. The structure and especially the conductive paths will get broken easily in particularly in the interconnection or interface region, so in the area in the vicinity of the stretchable and non-stretchable portions or rigid and non-rigid portions. It has also been discovered that the known solutions are not suitable for stretchable inks for example, because even the meandering patterns might weaken the durability of the stretchable ink. This is because the stretching is not appearing uniformly in or on the structure but the tension would rather tend to be stronger on the inside edge of the curve. The outcome is often, at least in the longer term, cracking and breaking of the structure, meandering patterns or conductive paths or possible non-stretchable portions.

SUMMARY OF THE INVENTION

An object of the invention is to alleviate and eliminate the problems relating to the known prior art. Especially the object of the invention is to provide a stretchable structure so that the breakage or other structural deformations of the conductors or other devices are eliminated or at least minimized.

The object of the invention can be achieved by the features of independent claims.

The invention relates to a stretchable structure according to claim 1. In addition the invention relates to a method for manufacturing the stretchable structure according to claim 16.

According to an embodiment of the invention a stretchable structure comprises or is at least configured to receive a conductive path (so a conductor) and an interface region so that the conductive path and the interface region are or become as integral parts of the stretchable structure. The stretchable structure may also comprise a component or at least it is configured to receive the component afterwards. The component is typically non-stretchable and/or rigid component, which can be or is integrated, such as glued, or welded, such as high frequency welded, laminated or screwed into the stretchable structure. The component may be e.g. an electronic, photonic, mechanical or electro-mechanical component, electronic module, printed circuit board, sensor, electrode, integrated circuit, a seam like a zipper, an intersection, reinforcement portion, a snap fastener element, device or component attachment, for example.

The conductive path is advantageously a stretchable conductive path either as such (made of stretchable material) or has a design (meander or zigzag design, for example) so to allow the conductive path to stretch with the stretchable structure when the stretchable structure is stretched. The stretchable structure has also typically an interconnection region along which the conductive path extends at least partly in/on said stretchable structure. The interconnection region is an area in the stretchable structure, where mechanical stretchability properties of the structure change at least in the direction of the conductive path in or on the stretchable structure and between the conductive path and the component. This is typically because the component and/or the interface region is often more rigid or the stretchability of which are/is less than one of the stretchable structure supporting said component.

The stretchable structure comprises also the interface region comprising a peripheral or boundary line, where the line comprises at least one inwardly curved portion. The form of the inwardly curved portion may be e.g. the form of an inverted teardrop or a fjord like recess pointing essentially towards the center or inner area of the interface region. According to the embodiment the component is advantageously arranged in the connection with said interface region and said stretchable conductive path is introduced with said component at least partly via said inwardly curved portion of said peripheral line of the interface region so to prevent or minimize stretching of the stretchable structure in the area of the interface region or in the area surrounded by said inwardly curved portion and thereby minimize the strain directed to the stretchable conductive path, such as the stretchable conductive path entering e.g. to the joint of the electrode or other component via said inwardly curved portion.

Advantageously the inwardly curved portion surrounds at least portion of the stretchable structure along which the stretchable conductive path as a whole or along which at least portion of the stretchable conductive path is introduced to the component. As an example the stretchable conductive path may be narrower than the inwardly curved portion, whereupon the inwardly curved portion surrounds the whole width of the conductive path.

Alternatively the stretchable conductive path may be wider than the inwardly curved portion, whereupon the inwardly curved portion surrounds only a portion of the width of the conductive path, and whereupon another portion of the width of the conductive path extends under the interface region and "out" of the inwardly curved portion. However it is to be noted that also in this embodiment at least portion of the stretchable conductive path is surrounded by the inwardly curved portion. Naturally the width of the stretchable conductive path may be same as the width of the inwardly curved portion.

In addition it is to be noted that the stretchable structure may have a number of smaller conductive paths which all are led via the same inwardly curved portion.

The opening angle of the inwardly curved portion is advantageously less than 180°, or more advantageously less than 130°, or even less than 90°, however not limiting to those examples only and depending on the need and applications. As an example the interface region with the inwardly curved portion has a form of a water lily, a snowflake or star like form with plurality of cusps, a shamrock, daisy, or a butterfly form or a form of any letter of C, H, Y, X, U, O, L, M, N, D, F, E, K and V or characters, like 3 or 8. These are only examples and naturally also other forms can be used which are suitable for the purpose of the invention.

The interface region is advantageously more rigid area or portion on or in the stretchable structure than the stretchable structure as such. According to advantageous embodiments of the invention the inwardly curved portions of the interface region has "protective effect" to the area of the stretchable structure surrounded by the inwardly curved portions so that when the stretchable structure is stretched or twisted, the stretching effect, torque or forces does not influence inside the area surrounded by the inwardly curved portions as much as without the interface region and the stretching or twisting forces will smoothly decrease or fall away in the direction of the opening or "throat" of the inwardly curved portion. Thus the inwardly curved portions according to the invention prevent or minimize or reduce enormous or significant stretching of the stretchable structure in the area of the interface region or in the area surrounded by said inwardly curved portion thereby minimizing the strain or other unwanted stretching or twisting forces directed to the stretchable conductive path especially in the connection with more rigid component.

The interface region may be provided in many different ways in or on to the stretchable structure. As an example, the component to be provided to the stretchable structure, such as a base or other part of the component, may comprise the interface region with the inwardly curved portion already before assembled into the stretchable structure. According to an embodiment the component may be a base or cover plate, such as a plastic plate of an electronic module or the like. The inwardly curved portion may be provided e.g. by cutting, milling, etching or 3D printing or molding or other known methods as a hollow or cavity with plurality of branches e.g. to the underside of the component structure, whereupon the hollows or cavities form said inwardly curved portions between the component and the stretchable structure in the final system. The conductive paths can then be provided through the component structure to the underside of the component, again to the hollows or cavities of the inwardly curved portions formed into the "backside" of the component and further via the inwardly curved portions to the interconnection region or to the outer region outside the essential sphere of the influence of the rigid or non-stretchable component in/on the stretchable structure.

It is to be noted that the component as such does not need to be in the form of the interface region with the inwardly curved portion, but the interface region with the inwardly curved portion can be provided into the underside of the component structure in the form wanted. In addition it is to be noted that the size of the component may be e.g. greater than the size of the interface region. The embodiments offer clear additional advantage, namely in this way the upper portion of the component can still serve base for electric components or other devices, for example, and thereby the components and conductors can be placed more closely to each other to save space. Furthermore it is to be noted that the component is advantageously non-stretchable and possibly also a rigid component, which can be integrated, such as glued, (high frequency) welded, laminated or screwed into the stretchable structure.

According to an exemplary embodiment the interface region may be provided as a reinforced region in or on said stretchable structure so that the shape of said reinforced region forms or introduces said inwardly curved portion. The inwardly curved portion lacks advantageously said reinforcing material or feature thereby remaining empty and functioning as said inwardly curved portion. In this embodiment the stretchability of the reinforced region is typically less that the stretchability of the stretchable structure as such.

As an example the interface region may be made by printing, laminating, gluing or welding, such as high frequency welding, or etching or using suitable masks or screwing a reinforcement pattern or region in/on the stretchable structure, and thereby forming said interface region and thereby also introducing said inwardly curved portion. The component may then be integrated in the connection with said interface region provided in or on to the stretchable structure.

Still in addition the interface region may be produced by a mesa technique so that the "leafs" of the interface region are left higher than the region surrounded by the "leafs" or structure of the interface region thereby forming hollows or cavities as said inwardly curved portions.

In addition a certain desired portion of the stretchable structure can be treated e.g. mechanically, chemically or using heat or other suitable known methods so to stiffen said certain desired portion to form the interface region with the inwardly curved portions.

Furthermore, according to an embodiment a certain desired portion of the stretchable structure can be treated to be a hydrophobic/hydrophilic region so that an adhesive material or reinforcing material can either stick in it or not, thereby forming said interface region with the inwardly curved portions. The interface region can also be printed by adhesive material so that the reinforcing material will stick in the printed area and thereby form said interface region with the inwardly curved portions.

It is to be noted that according to embodiments of the invention the interface region may be provided either inside or on the surface of the stretchable structure. In addition the interface region may be provided either on the same side or on the opposite side as the component and/or the conductive path. The interface region stiffens and makes the stretchable structure more rigid in the region of said provided interface region on both sides of the stretchable structure, no matter which side the interface region is provided, and provides thereby suitable inwardly curved portions in the connection with the interface region. However, the region surrounded by the inwardly curved portion is advantageously remained more stretchable than the rigid area of the interface region.

As an example, the interface region may also be arranged between at least two components located on the stretchable structure so that both components have e.g. elongated portions and the inwardly curved portion is remained between said elongated portions of the components. In this way the components may be coupled with the same interface region and for example the conductive paths between the components can be led in the stretchable structure through the "fjord" portions formed by the inwardly curved portions of the interface region.

The conductive path can be provided with methods known from prior art and can comprise e.g. stretchable and conductive ink, stretchable and conductive paste, stretchable and conductive polymer film cut to suitable form, stretchable and conductive fabric or textile (cut to form) or meander or wavy shaped carbon, gold, copper, silver, steel or aluminum conductive path. It is to be noted that the meander or wavy shaped carbon, gold, copper, silver, steel or aluminum conductive path may be actually non-stretchable as such, but the overall stretchability of the structure can be achieved by the design of the conductive path, whereupon e.g. the 2D or 3D transformation of the conductive path may allow the overall stretchability of the structure. In addition it is to be noted that according to an embodiment the meander or wavy shaped conductive paths are essentially non-stretchable paths as such, whereupon it is advantageous according to some embodiments of the invention that the inwardly curved portion surrounds the conductive path of the above mentioned non-stretchable path as a whole, such as the non-stretchable meander or wavy shaped path.

The stretchable structure as such functions as a substrate and carries the component and conductive path, as well as the interface region with inwardly curved portions. The stretchable structure may comprise e.g. polymer film, rubber, silicone elastomer, stretchable fabric or textile or composite structure of comprising the fabric or textile, nonwoven fabric or paper.

The present invention offers advantages over the known prior art. When the conductors or conductive paths are routed through the fjord-like openings of the inwardly curved portion, they can be entered to the rigid area at a point of lowest strain and the transition from a stretchable region to a rigid area can be provided without noticeable interface or mechanical discontinuity, thereby preventing or minimizing stretching of the stretchable structure in the area of the interface region or in the area surrounded by said inwardly curved portion and thereby minimizing the strain directed to the stretchable conductive path. Thus the structure of the invention can be effectively used for protecting the conductors or conductive paths from being broken or cracking due to stretching and/or twisting of the stretchable structure and thereby extending the life span of the whole system having the structure of the invention considerably.

In addition, when the interface region with the inwardly curved portions (e.g. suitable hollows or cavities) is provided in the connection with the component, such as on the underside of the component to be faced against the stretchable structure, the upper portion of the component can still be used for electronic component or other devices, for example, whereupon the electronic component or other devices can be placed more closely to each other and space can be saved in the whole system. Also the manufacturing is very easy and fast when the interface region with the inwardly curved portions is provided directly with the connection of the component. The interface region with the inwardly curved portions can also be provided very easily, accurately and in a fast way e.g. by printing (or by other ways described in this document) directly on the surface of the stretchable structure.

The exemplary embodiments presented in this text are not to be interpreted to pose limitations to the applicability of the appended claims. The verb "to comprise" is used in this text as an open limitation that does not exclude the existence of also unrecited features. The features recited in depending claims are mutually freely combinable unless otherwise explicitly stated.

The novel features which are considered as characteristic of the invention are set forth in particular in the appended claims. The invention itself, however, both as to its construction and its method of operation, together with additional objects and advantages thereof, will be best understood from the following description of specific example embodiments when read in connection with the accompanying drawings.

BRIEF DESCRIPTION OF THE DRAWINGS

Next the invention will be described in greater detail with reference to exemplary embodiments in accordance with the accompanying drawings, in which.

DETAILED DESCRIPTION

Figure 1A:
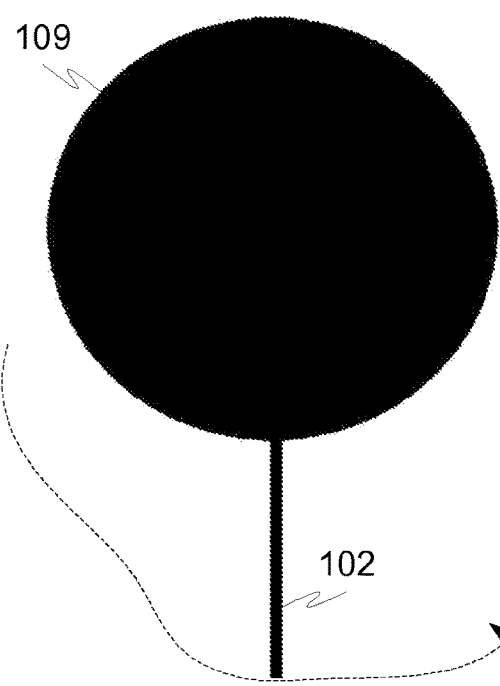
FIGS. 1A-B illustrate a principle of an exemplary prior art solutions for coupling a stretchable conductive path with a component.
Figure 1B:
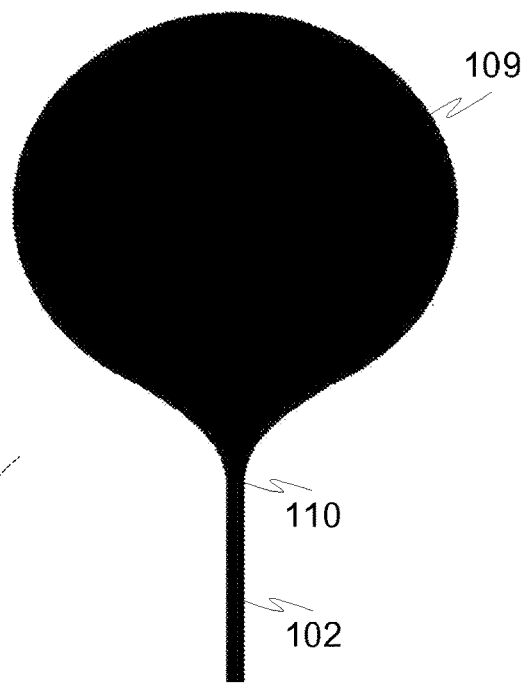

FIGS. 1A-B illustrate principles of an exemplary prior art solutions, where a stretchable structure 101 carries a rigid device 109 and a conductive path 102, which is coupled with the rigid device 109. In FIG. 1A mechanical interface between the conductive path 102 and the rigid device 109 is very sharp and the forces induced to the conductive path 102 in the vicinity of the rigid device 109 can be enormous and discontinuous and thereby cause easily breakage through mechanical cracking to the conductive path 102.

FIG. 1B illustrates a prior art teardrop structure 110 used to spread the structural stress induced to the conductive path 102 more smoothly and more larger area to other portions of the stretchable structure 101 especially in the vicinity of the non-stretchable component 109 in order to reduce the structural stress induced into the conductive path 102 in the vicinity of the rigid device 109. However, also this solution has drawbacks, namely the teardrop structure 110 does not protect the conductive path 102 in the lateral direction, so when the stretchable structure 101 is e.g. twisted or stretched in the direction more or less perpendicular to the travel direction of the conductive path 102, whereupon the conductive path 102 will easily get broken or cracked due to lateral stress.

Figure 2:
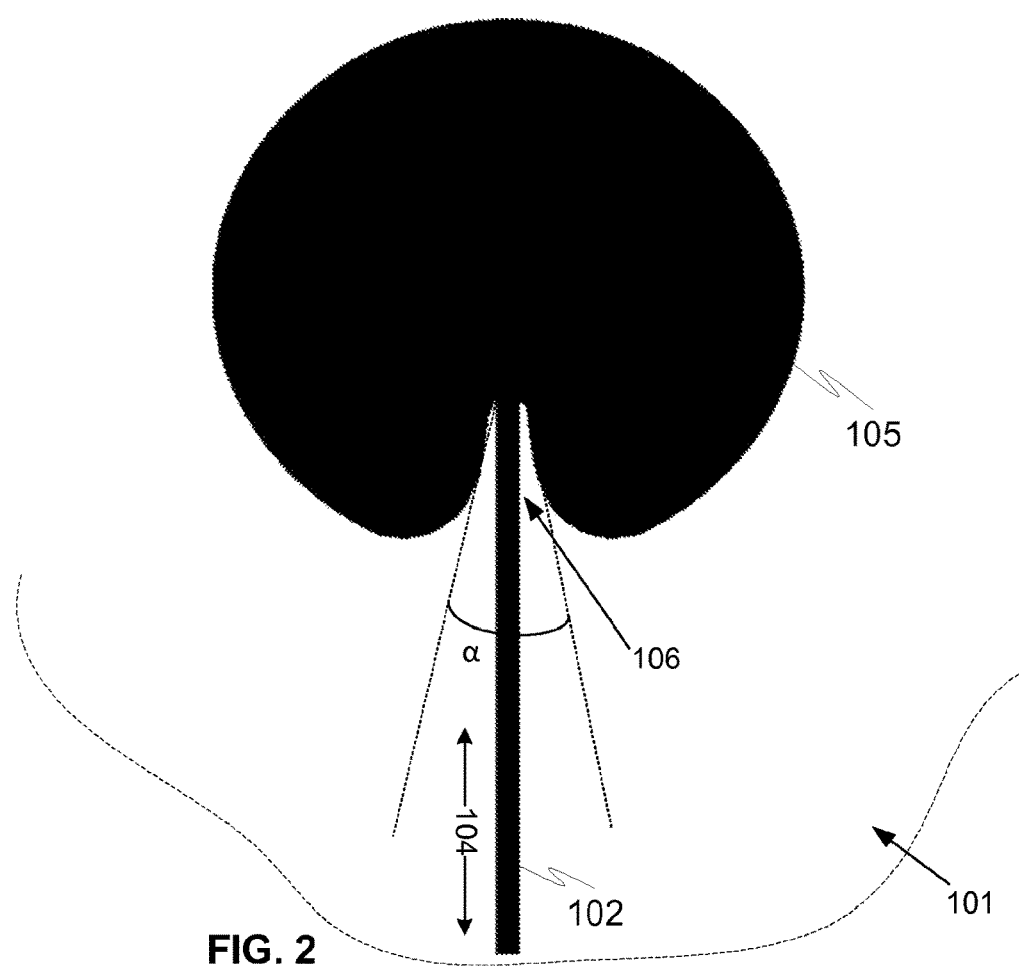
FIG. 2 illustrates an exemplary principle for coupling a stretchable conductive path with a component via an interface region according to an advantageous embodiment of the invention.

FIG. 2 illustrates an exemplary principle for coupling a conductive path 102 with an interface region 105 in a stretchable structure 101 according to an advantageous embodiment of the invention, where the inwardly curved portion 106 surrounded and formed by the interface region 105 can be clearly seen. The form of the inwardly curved portion 106 is advantageously the form of an "inverted teardrop" or a fjord like recess pointing towards the center area of the interface region 105 even though also other forms can be applied, as described in this document. The opening angle α of the inwardly curved portion is advantageously less than 180°, or more advantageously less than 130°, or even less than 90°, so to apply the protective effect e.g. against the later stretching or twisting.

Figure 3A:
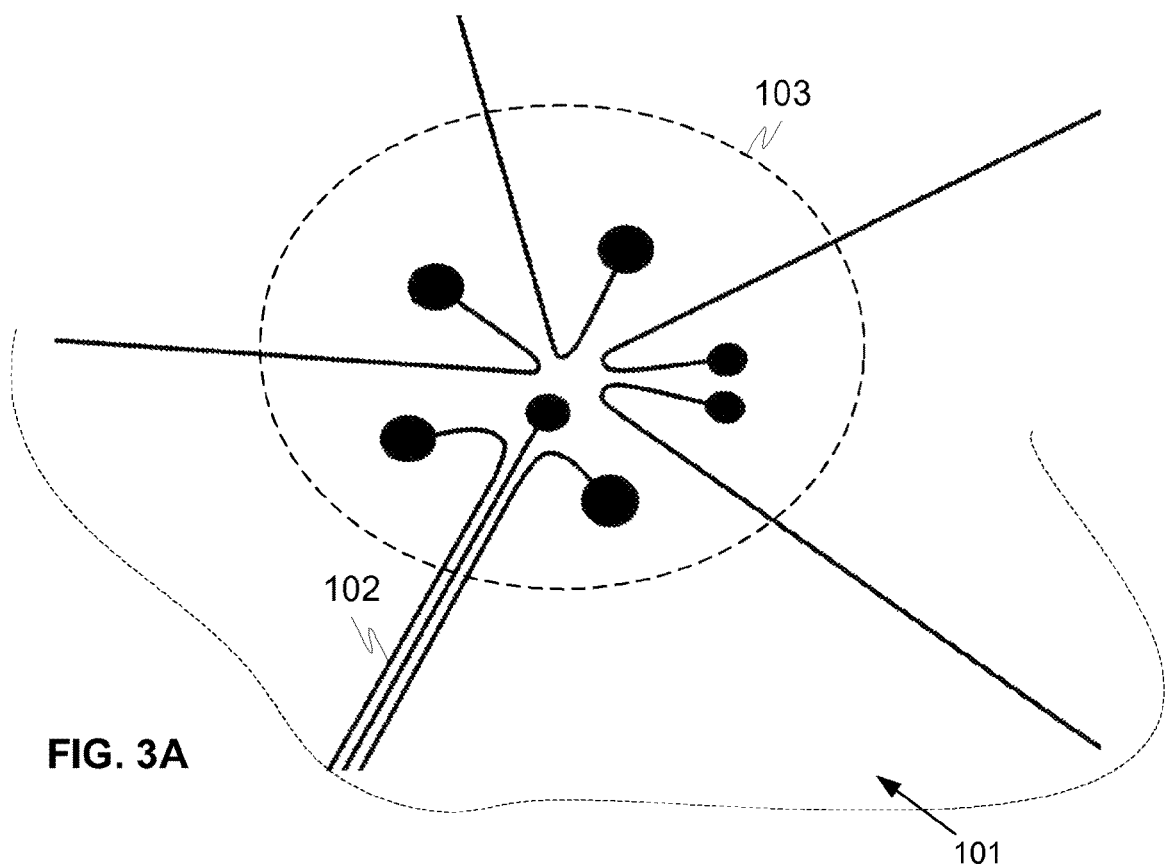
FIGS. 3A-13D illustrate exemplary embodiment for coupling a stretchable conductive path with a component via an interface region according to advantageous embodiments of the invention.
Figure 3B:
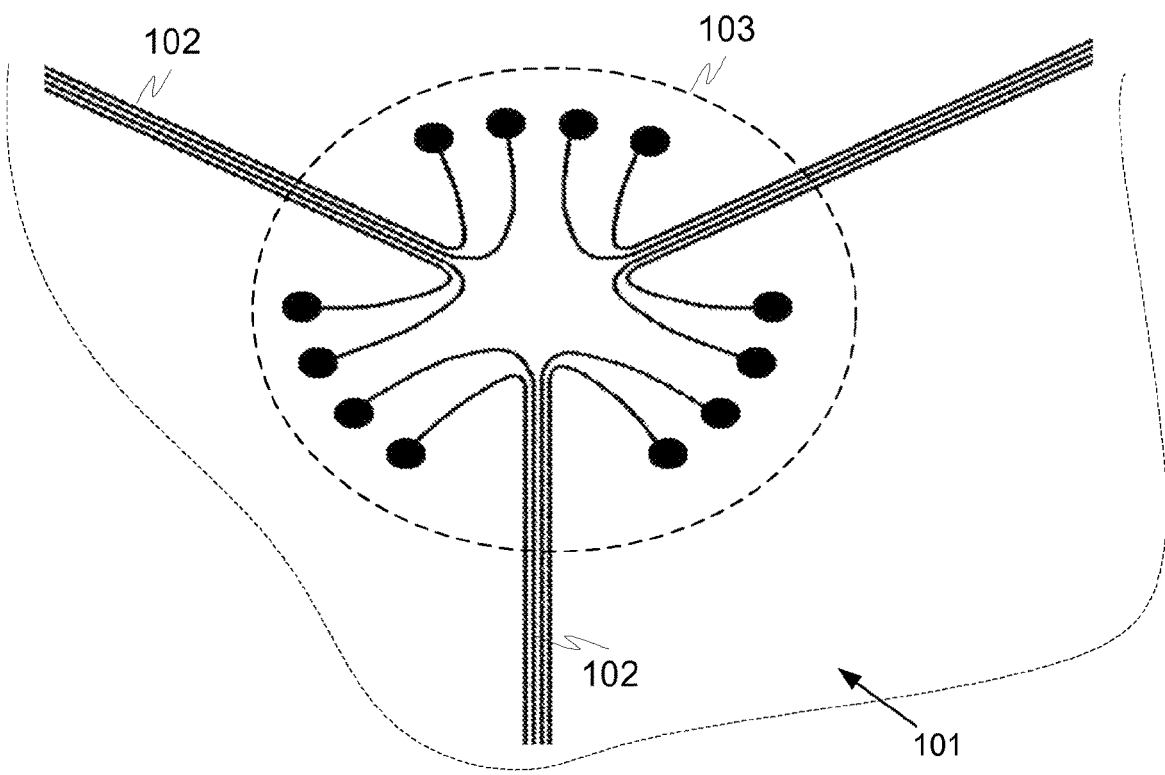

FIGS. 3A-12B illustrate exemplary embodiments for providing the stretchable structure 101 with a conductive path 102 and interface region 105 with number of inwardly curved portions 106, as well as with optional components according to advantageous embodiments of the invention. FIG. 3A-B illustrate examples, where the conductive paths 102 are provided into the surface of the stretchable structure 101 and where the interconnection region 103 near the rigid component (not shown) is formed.

Figures 4A, 4B:
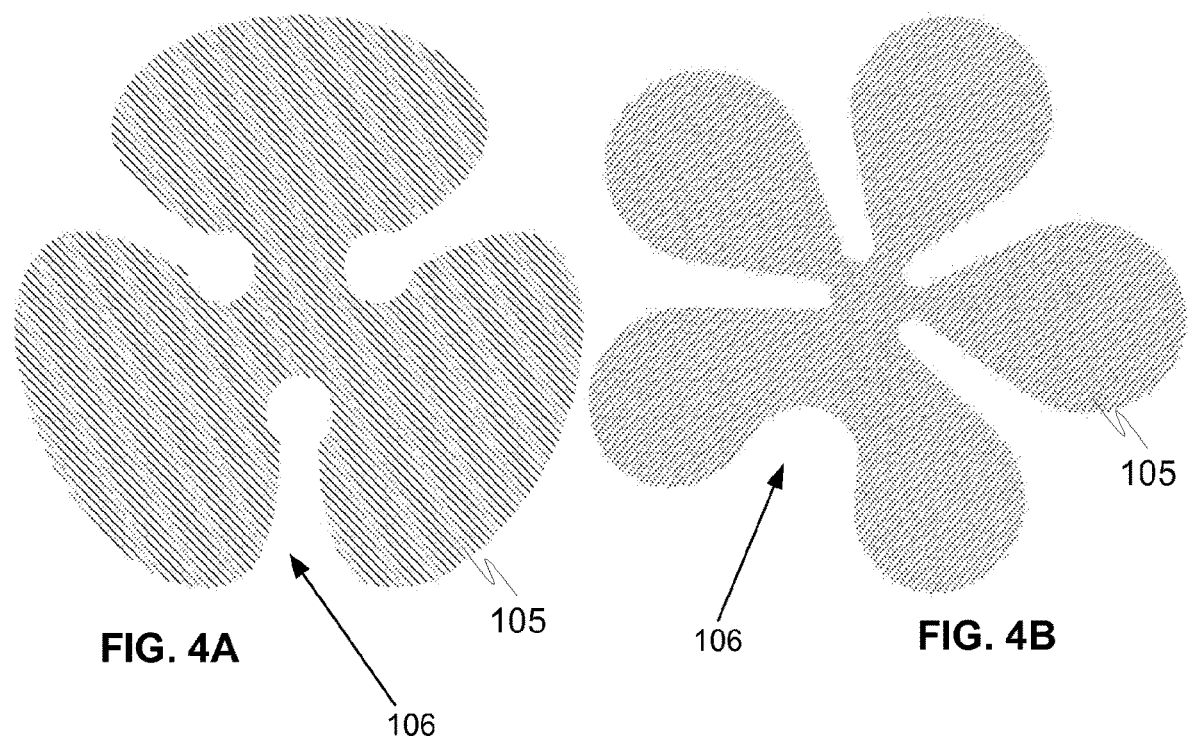

FIG. 4A-B illustrate exemplary embodiments for providing the interface region 105 with different form in or on to the stretchable structure 101. The interface region 105 is advantageously applied between the stretchable structure 101 and the component, even if it should be noted that the interface region 105 may also be applied on the opposite side of the stretchable structure 101 than the component and/or conductive paths 102, because the influence or protective effect of the interface region 105 with the inwardly curved portions 106 will be extended through the stretchable structure 101 to the other side also. In addition, as discussed elsewhere in this document the interface region 105 may be provided in many different ways in or on to the stretchable structure 101, and depending on the solution and final product desired, the design or form of the interface region and especially its' peripheral line may vary, as well as the number of inwardly curved portions 106 and the opening angle or other properties of it. For the final product the component 107 can be provided on the top or otherwise in the connection with the interface region 105.

Figure 5A:
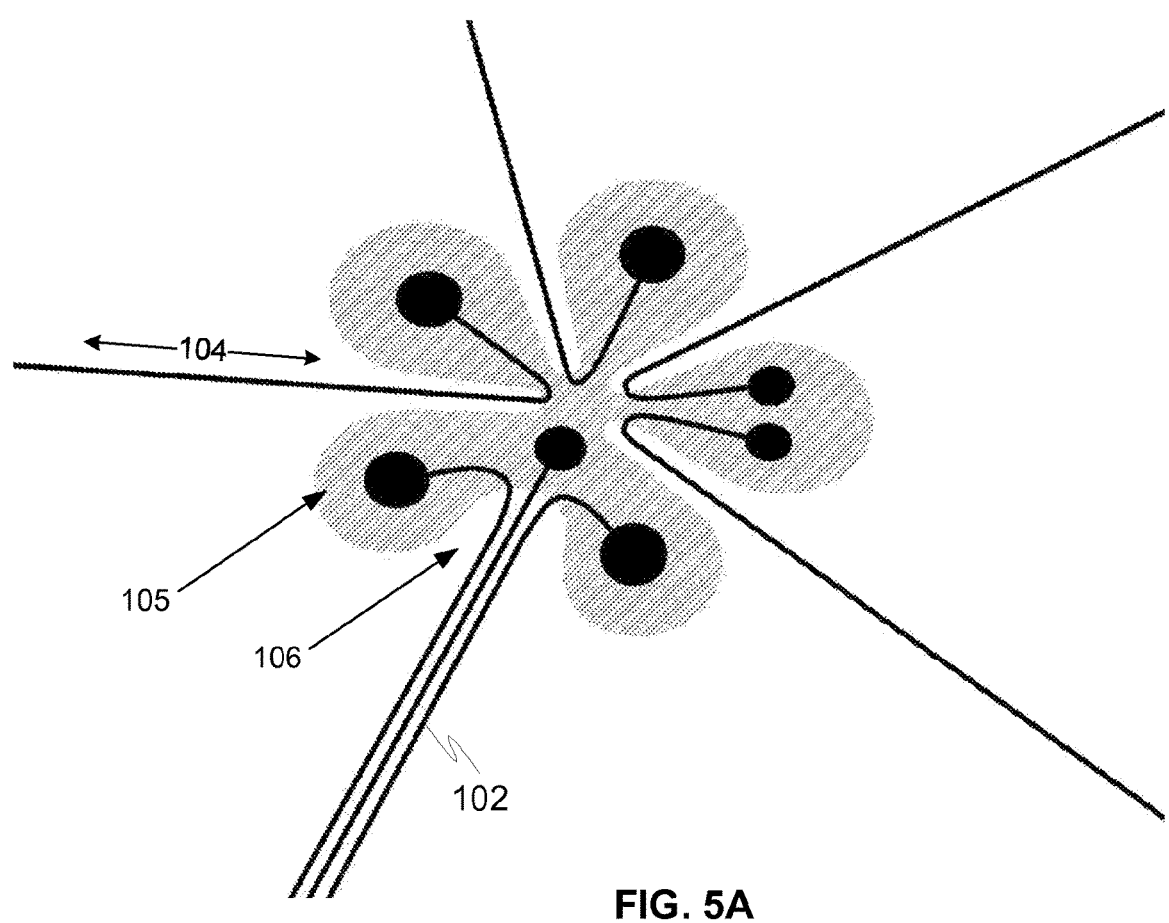
Figure 5B:
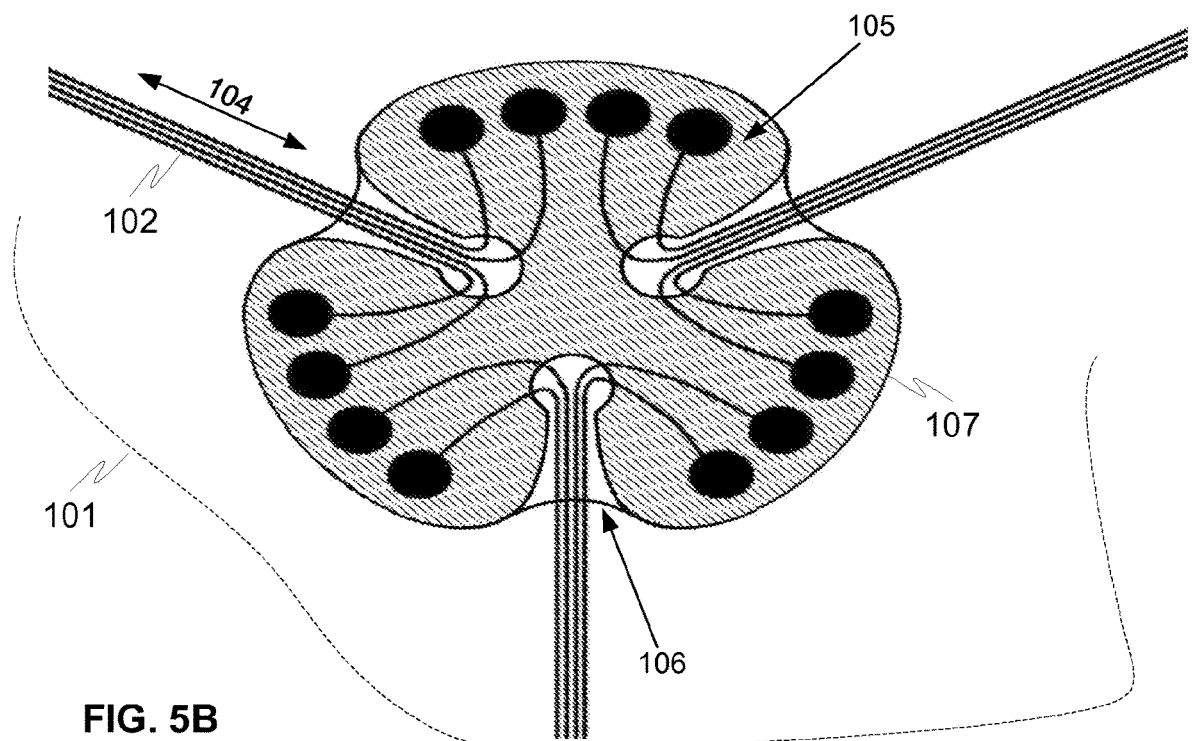
Figure 5C:
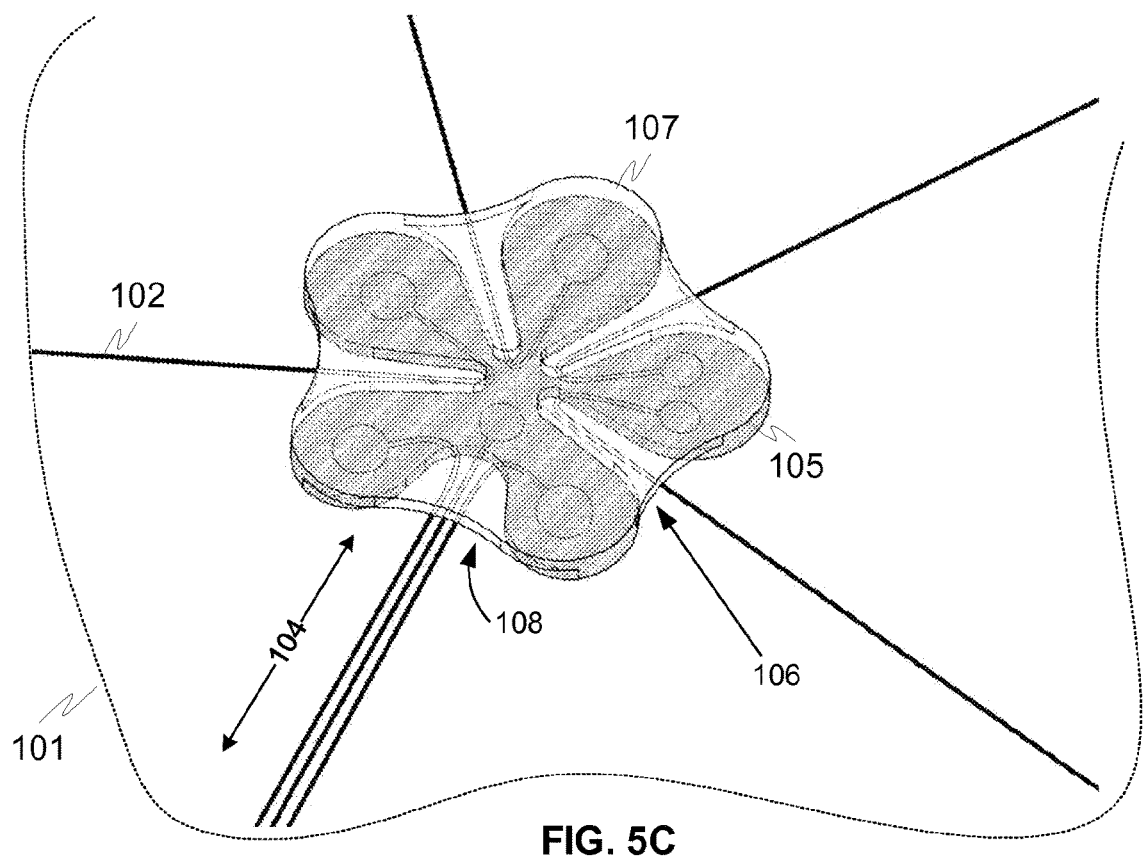
Figure 5D:
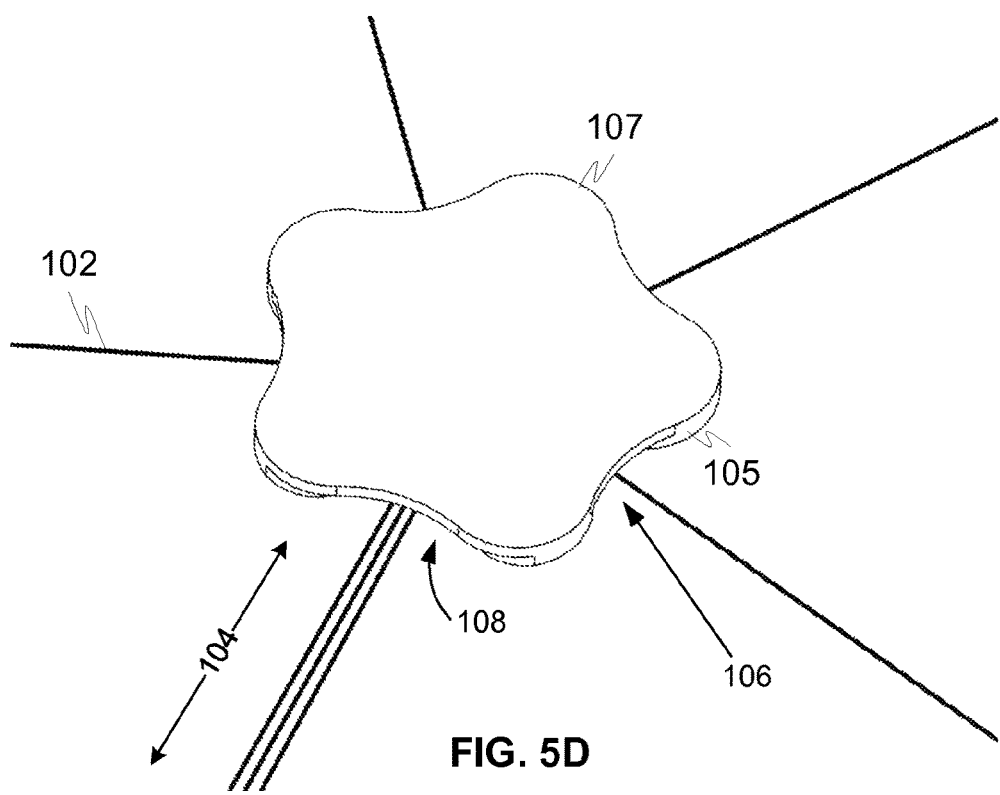
Figure 5E:
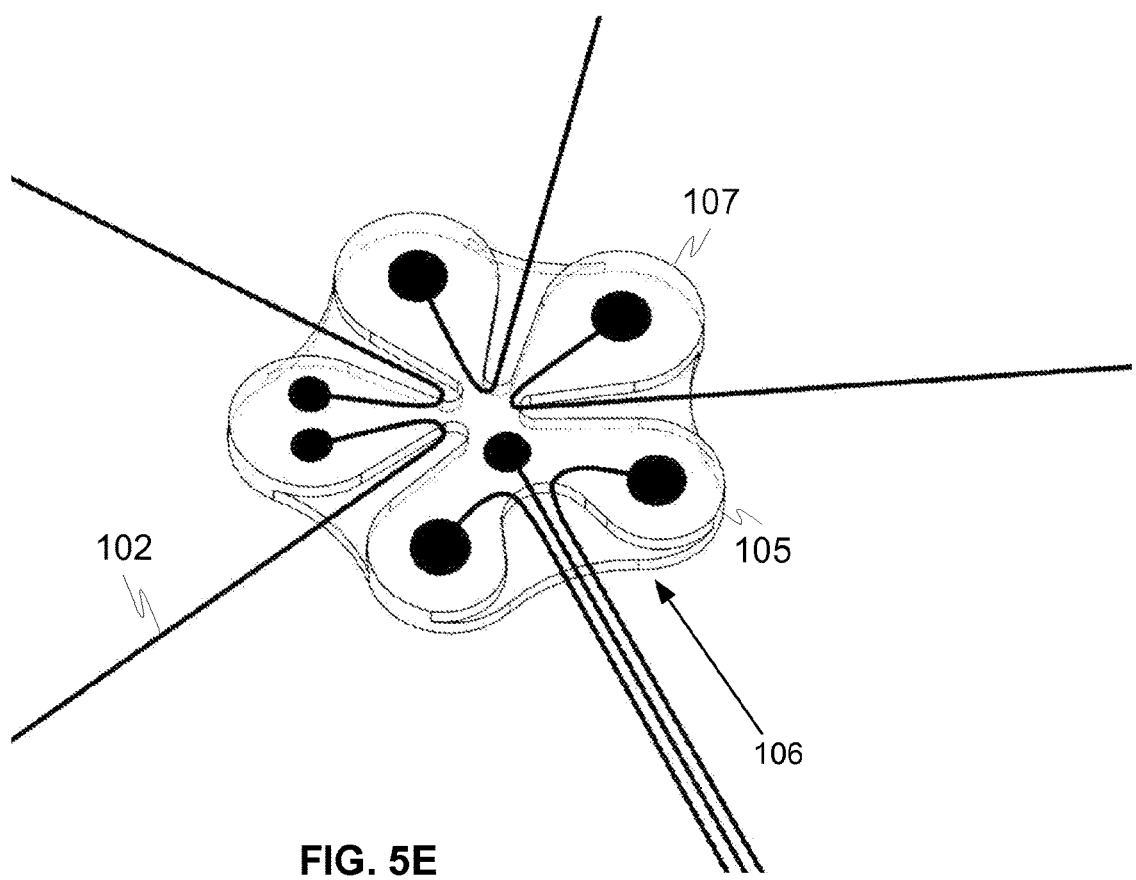

FIG. 5A-B illustrate an example, where the conductive paths 102 are provided on the stretchable structure 101. The peripheral line of the interface region 105 can be already seen in FIG. 5A as well as the inwardly curved portions 106. According to an exemplary embodiment the interface region 105 with the inwardly curved portions 106 can be implemented by providing glue or other adhesive material onto the stretchable structure 101, after which the component 107 can be placed onto the glue or other adhesive material, whereupon the inwardly curved portions 106 are remained as a non-glued area (or even as a hollow or cavity) between the component and the stretchable structure 101, as is the case in FIGS. 5B-5E.

Figured 5C-5E illustrate different components 107 (or covers or bases of them) used in connection with the stretchable structure 101 according to exemplary embodiments of the invention. The component 107 may also comprise the interface region 105 with the suitable inwardly curved portions 106 already provided directly to the component. For example the inwardly curved portions may be implemented as hollow or other cavity structures 108 to the component 107, such as into the underside portion of the component 107, which is then faced against the surface of the stretchable structure 101. The inwardly curved portions may be implemented by cutting, milling, etching, 3D printing or molding, for example, but naturally also other known prior art methods can be used.

According to an embodiment both the stretchable structure 101 and the component 107 may comprise at least portion of the interface region 105 so to provide suitable inwardly curved portions 106 in or on to the stretchable structure 101 for the conductive paths 102. It is to be noted that the size of the component 107 may differ from the size of the interface region, and may be e.g. greater than the size of the interface region 105.

Figure 6A:
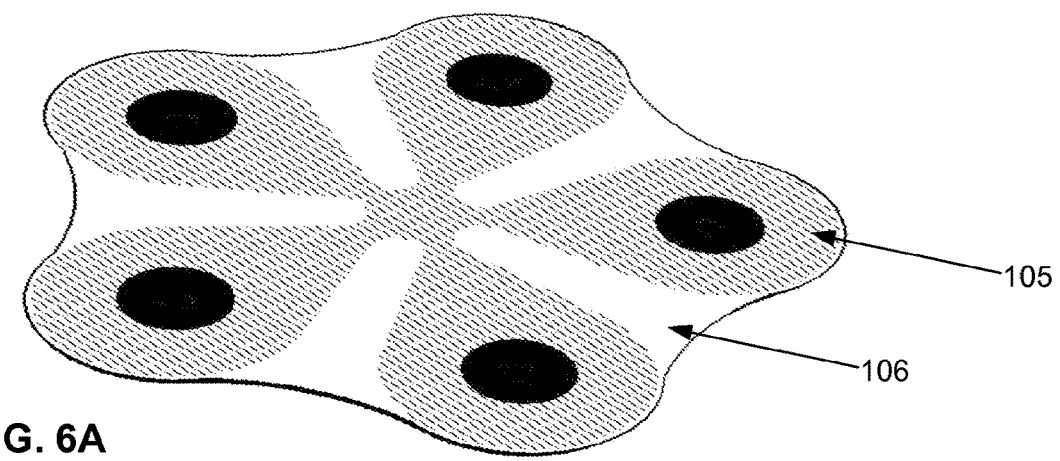
Figure 6B:
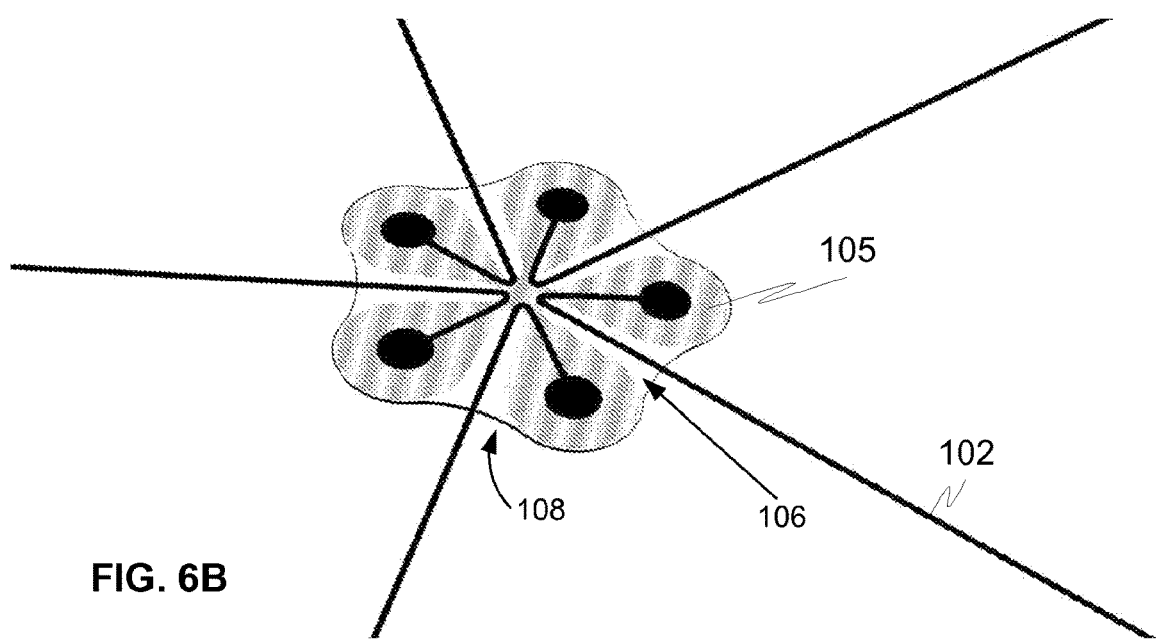
Figure 6C:
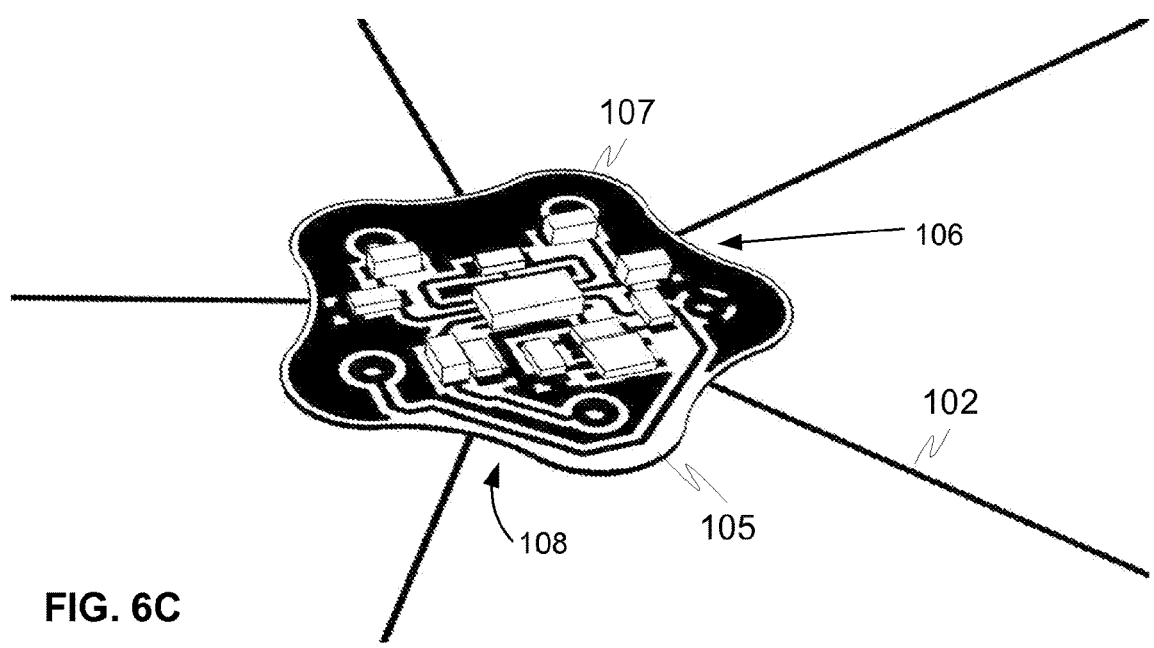

FIGS. 6A-C illustrate exemplary embodiments, where the interface region 105 is implemented by providing an adhesive layer into the underside of the component 107, where the adhesive layer is cut to a shape of the interface region 105. The adhesive layer may be implemented e.g. by an adhesive film, which as such is cut to the shape of the interface region 105. Alternatively or in addition to, also an additional non-adhesive film (mask) can be used between the stretchable structure 101 and the component 107 (component with the adhesive film) in order to provide an area of the inwardly curved portions 106.

As can be seen in FIG. 6C the upper portion of the component 107 can still serve a base for electric components, for example. In this way the electric components can be integrated in/on to the stretchable structure 101 placed closer to each other and thereby save the space.

Figure 7:
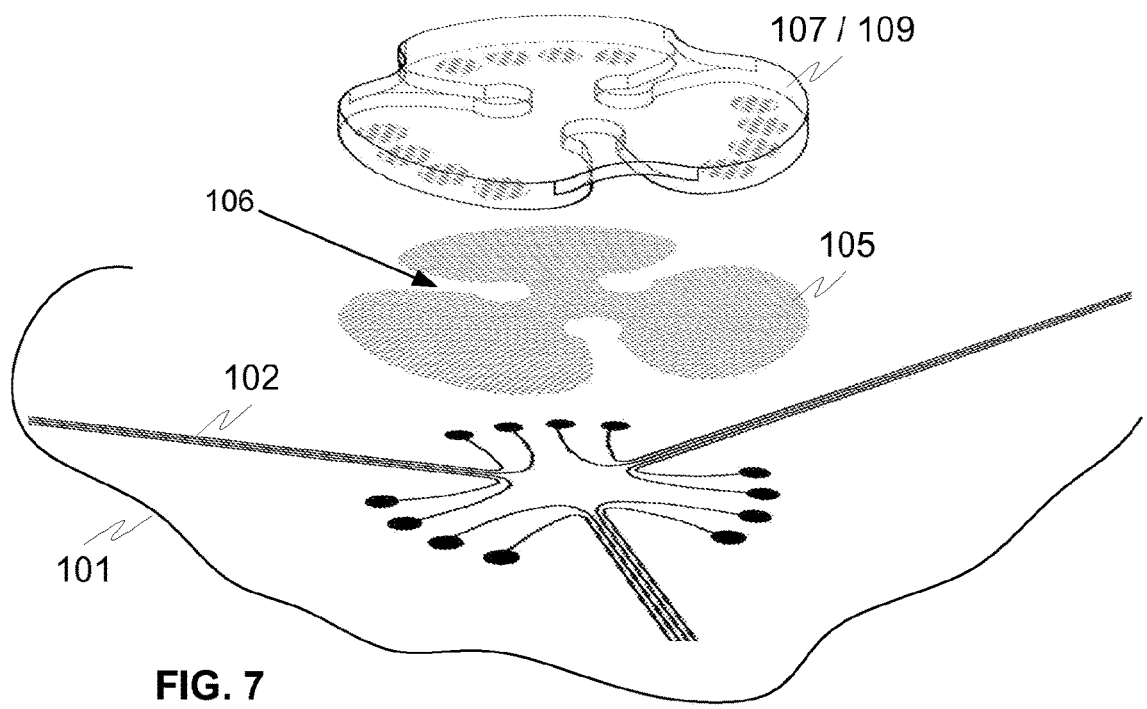
Figure 8A:
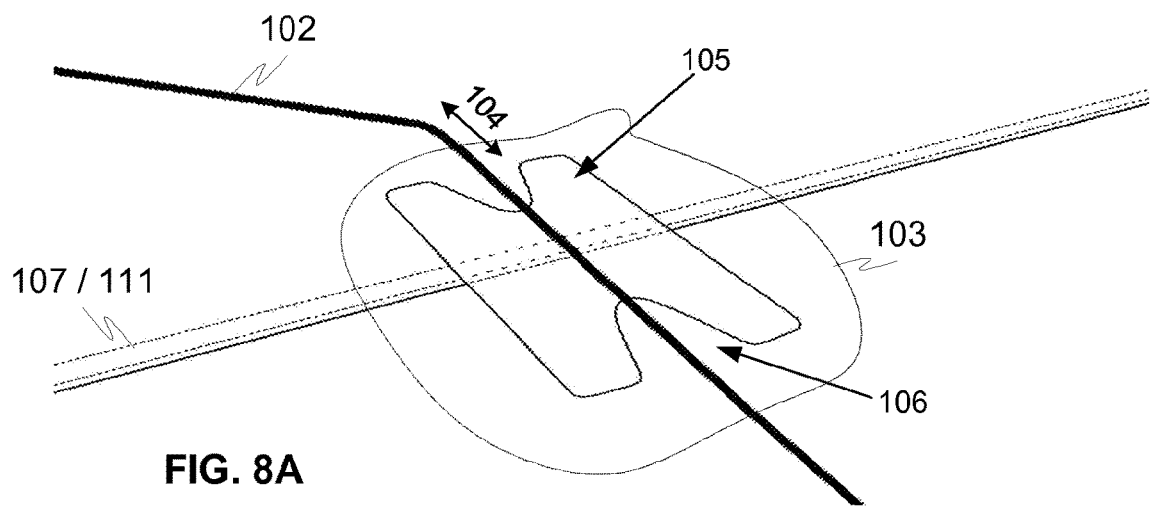
Figure 8B:
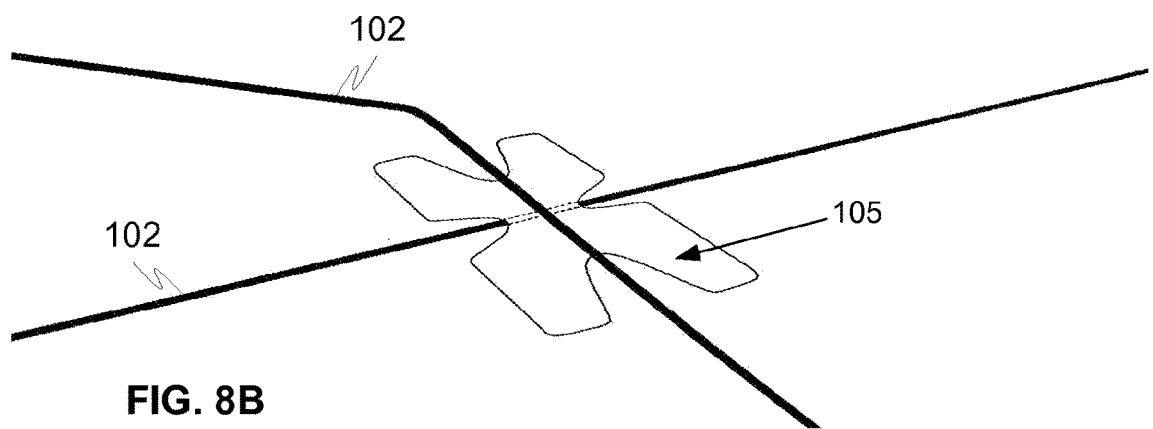

FIG. 7 illustrates an example of a final product, where the stretchable structure 101 comprises or is configured to receive the conductive paths 102 in or on it, as well as the interface region 105 with the inwardly curved portions 106. The interface region 105 can be implemented in any way described elsewhere in this document, and can be as an adhesive area and/or additionally provided into the underside of the component 107 or other rigid device 109. FIGS. 8A-B illustrate exemplary embodiments of the interface region 105 with inwardly curved portions 106 used in or on stretchable structure 101 for providing a protective "bridge" for the conductive path 102 over or under an region, where the mechanical rigidity or stretchability of the stretchable structure 101 has discontinuity regions or where the mechanical rigidity or stretchability of the stretchable structure 101 change clearly. This kind of discontinuity regions may be caused by another conductive path 102 or by another component 107/111, such as a seam, a zipper in a clothing for example, an intersection, reinforcement portion or a snap fastener element, for example. In these embodiments the interface region 105 is advantageously more rigid and/or less stretchable than the material of other components or structure, such as the stretchable structure 101. In addition the interface region 105 may be even more rigid and/or less stretchable than the material of the component 107/111.

FIGS. 9A-D illustrate exemplary embodiments for implementing the stretchable structure 101 and the interface region 105 for different purposes according to the invention. The form or shape or design of the interface region 105 and the inwardly curved portions 106 can vary depending e.g. on the final needs and products, and can be e.g. a form of a water lily, snowflake like form with plurality of cusps, shamrock, daisy, or a butterfly form or form of any letter of C, H, Y, X, U, O, L, M, N, D, F, E, K and V. The interface region 105 can be used for example providing protective support for a branching point for conductive path 102.

Figure 9A:
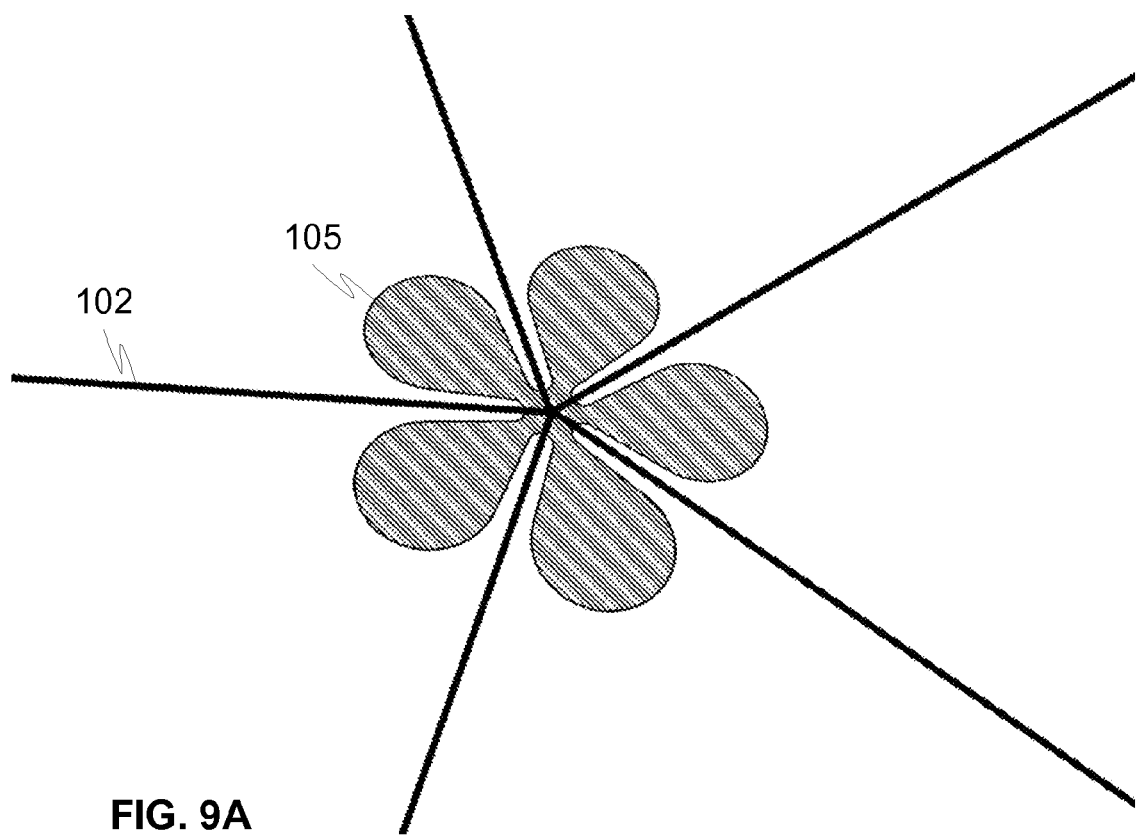
Figure 9B:
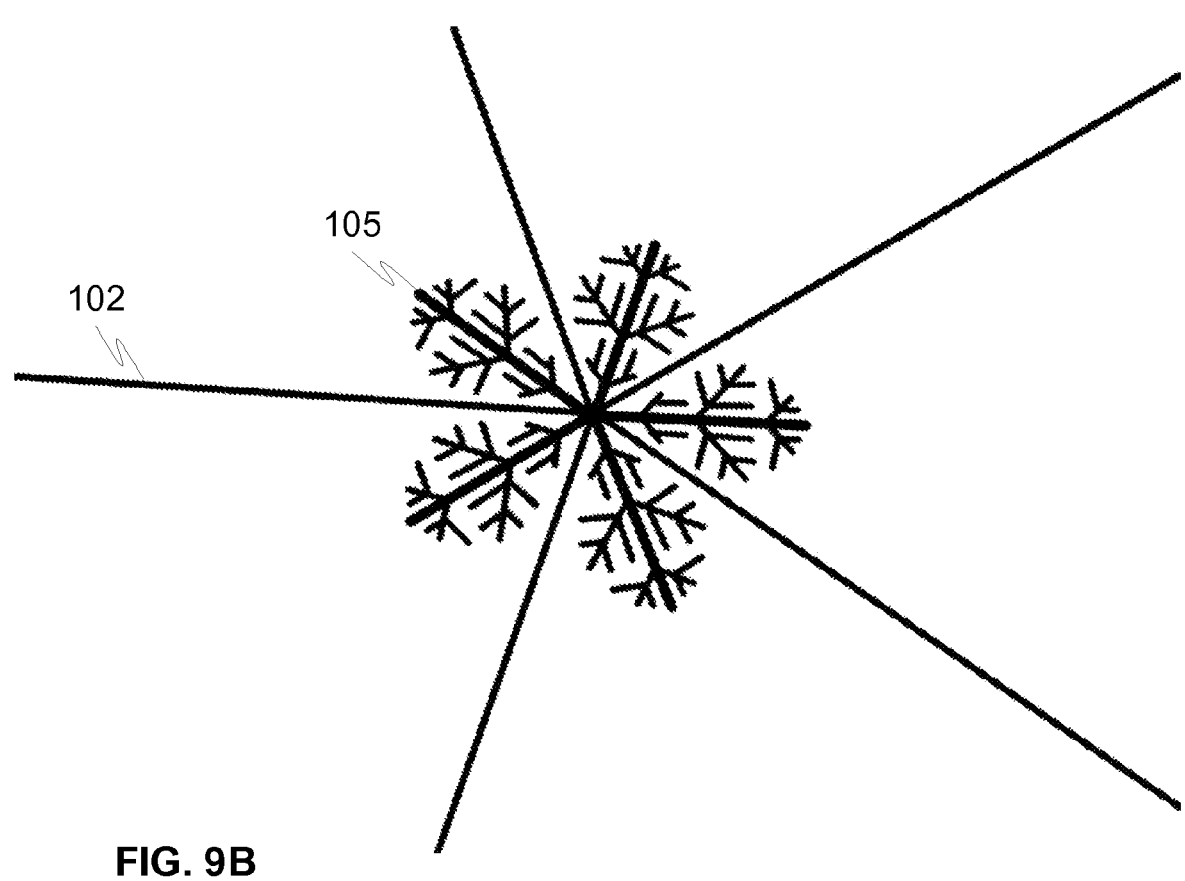
Figure 9C:
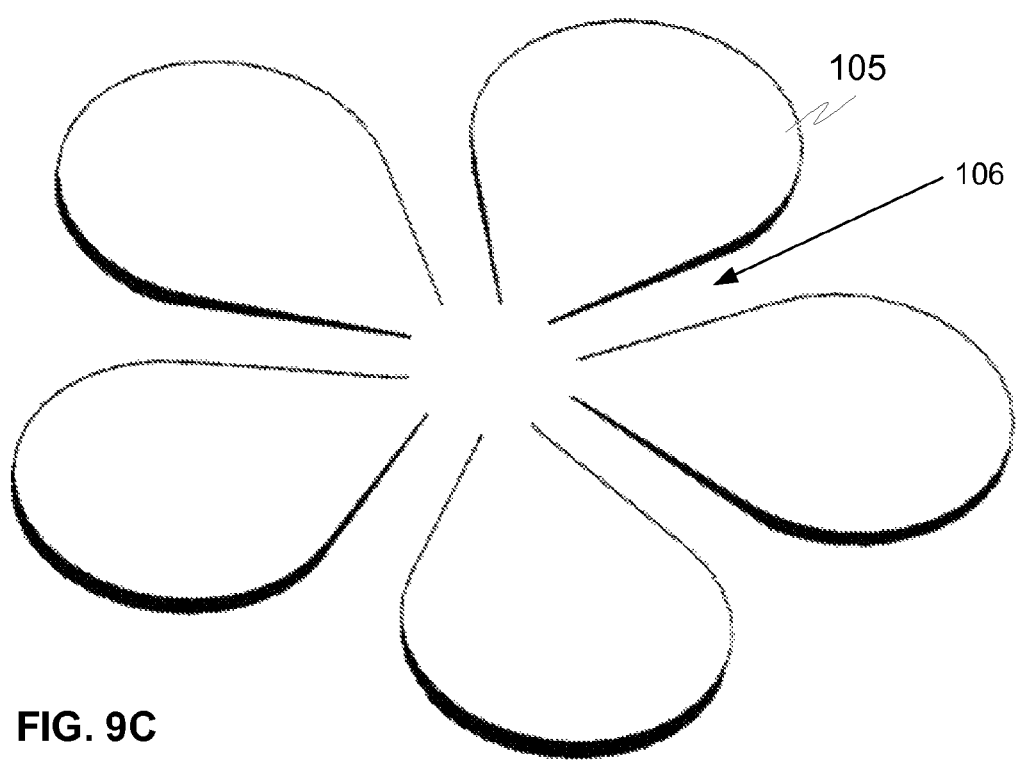
Figure 9D:
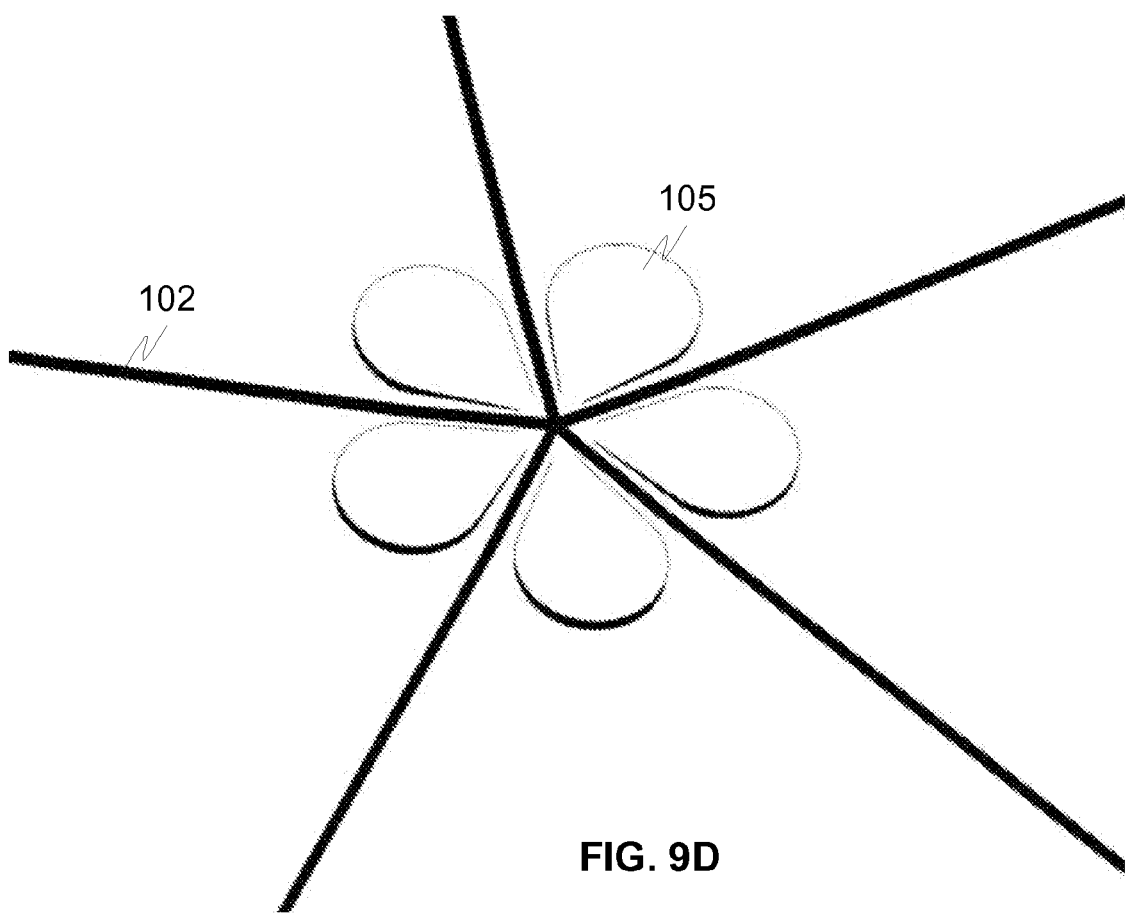
Figure 10A:
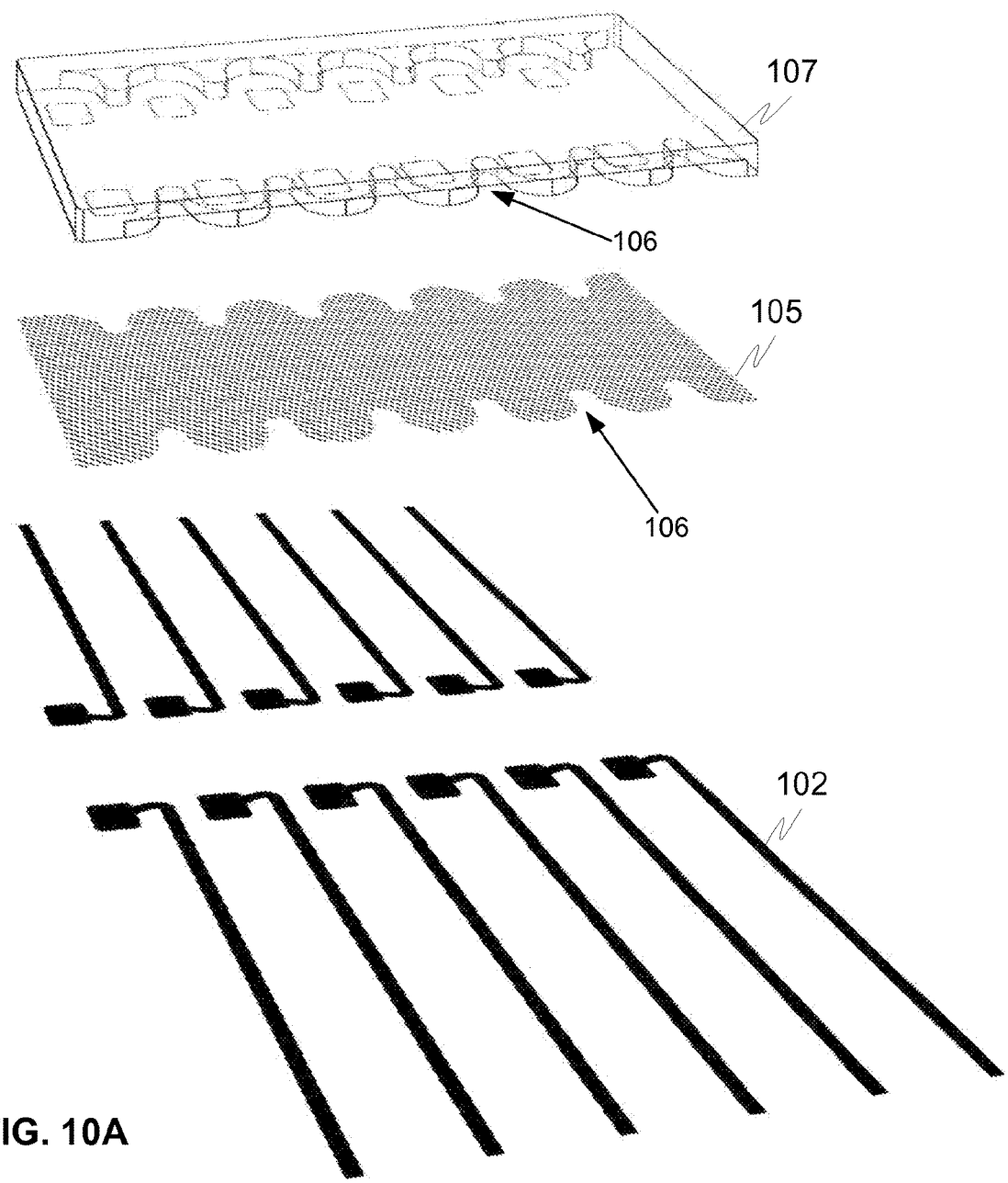
Figure 10B:
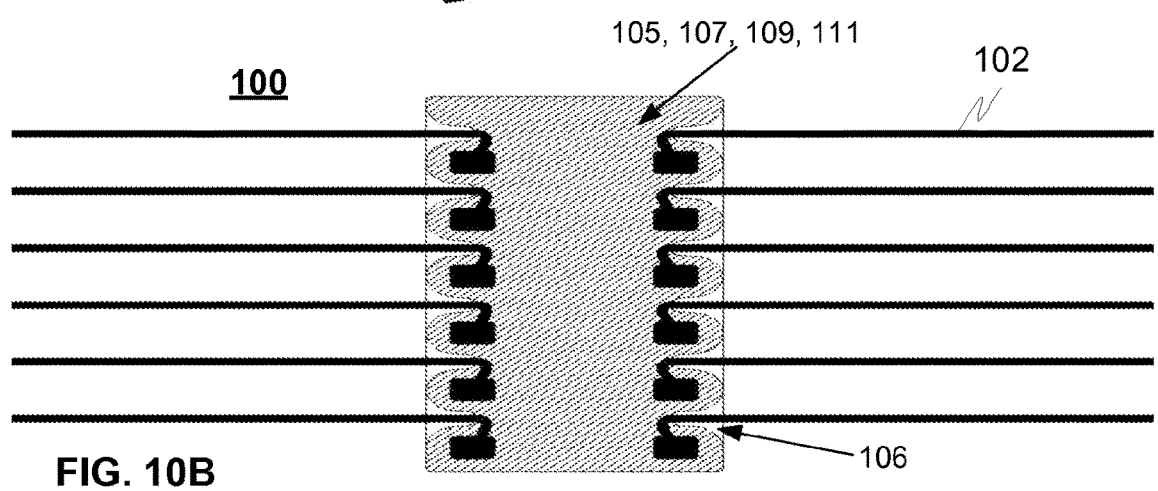

In addition the interface region 105 and the inwardly curved portions 106 can be provided in many different ways, as is described elsewhere in this document. For example FIGS. 9C-D illustrate an example, where the interface region 105 is a reinforced region 105 provided in or on said stretchable structure 101 so that the shape of said reinforced region 105 forms or introduces the inwardly curved portions 106. In this embodiment the reinforcing material or feature is applied in/on to the stretchable structure 101 so that the inwardly curved portions 106 lack said reinforcing material or feature. Other way to provide the interface region 105 is to apply mesa technique so that the "leafs" are left higher than the region surrounded by the "leafs" or structure of the interface region 105 (mesa technique).

The interface region 105 can be manufactured or provided e.g. by printing, laminating, gluing or (high frequency) welding or etching the reinforcement pattern (region) 105 in or on to the stretchable structure 101, or using suitable masks and thereby forming the interface region 105 and thereby also introducing the inwardly curved portions 106. In the final product the stretchability of the reinforced region 105 is typically less than the stretchability of the stretchable structure 101 and/or the reinforced region 105 is typically more rigid than the stretchable structure 101.

In addition a certain desired portion of the stretchable structure 101 can be treated e.g. mechanically, chemically or using heat or other suitable known methods so to stiffen said certain desired portion to form the interface region 105 with the inwardly curved portion 106. Furthermore, according to an embodiment a certain desired portion of the stretchable structure 101 can be treated to be a hydrophobic/hydrophilic region so that an adhesive material or reinforcing material can either stick in it or not, thereby forming said interface region 105 with the inwardly curved portions 106. The interface region 105 can also be printed by adhesive material so that the reinforcing material will stick in the printed area and thereby form said interface region 105 with the inwardly curved portions 106.

FIGS. 10A-11D illustrate exemplary embodiments and methods for manufacturing the final product 100, where the stretchable structure 101 is provided by the conductive paths 102 in or on it. In addition the interface region 105 with the inwardly curved portions 106 is provided, for example by printing or laminating or by using the component 107, which underside is shaped as the interface region 105 with the inwardly curved portions 106. The interface region 105 can be implemented in any way described elsewhere in this document, and can be as an adhesive area and/or additionally provided into the underside of the component 107. The final product 100 is shown in FIG. 10B.

Figure 11A:
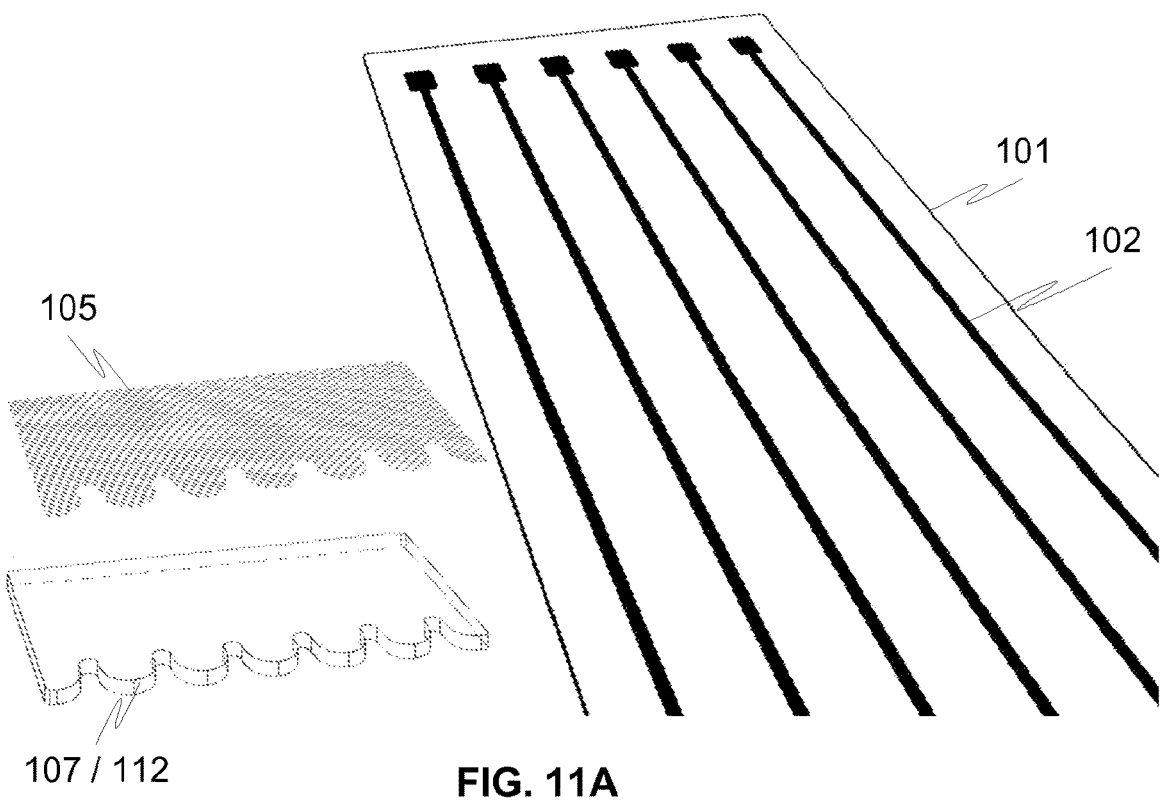
Figure 11B:
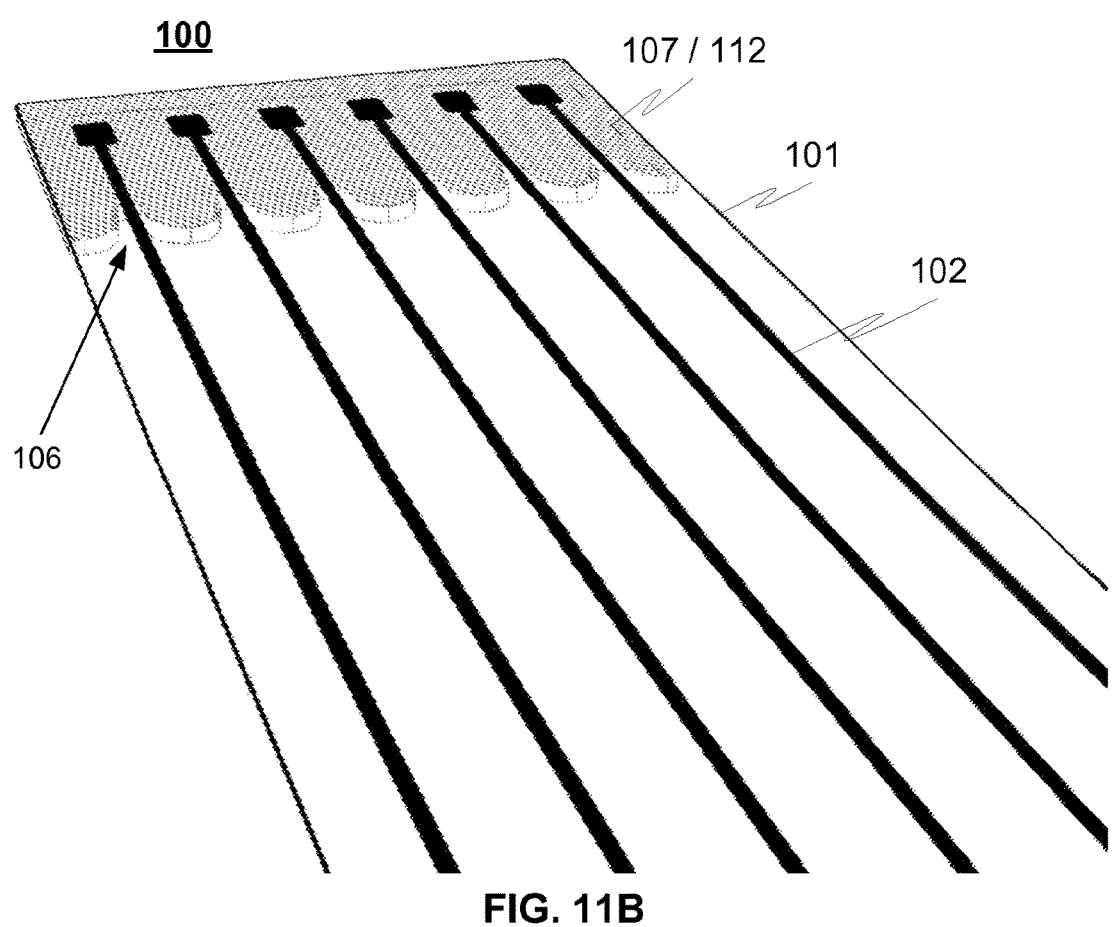
Figure 11C:
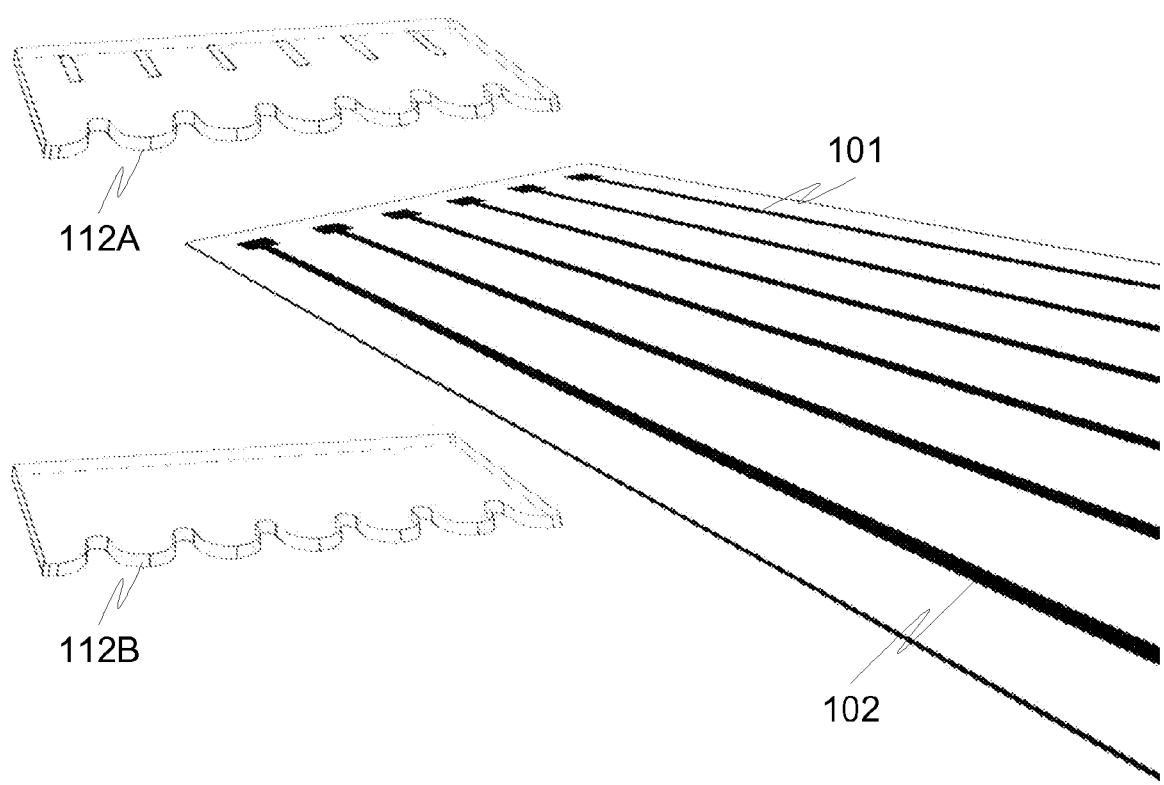
Figure 11D:
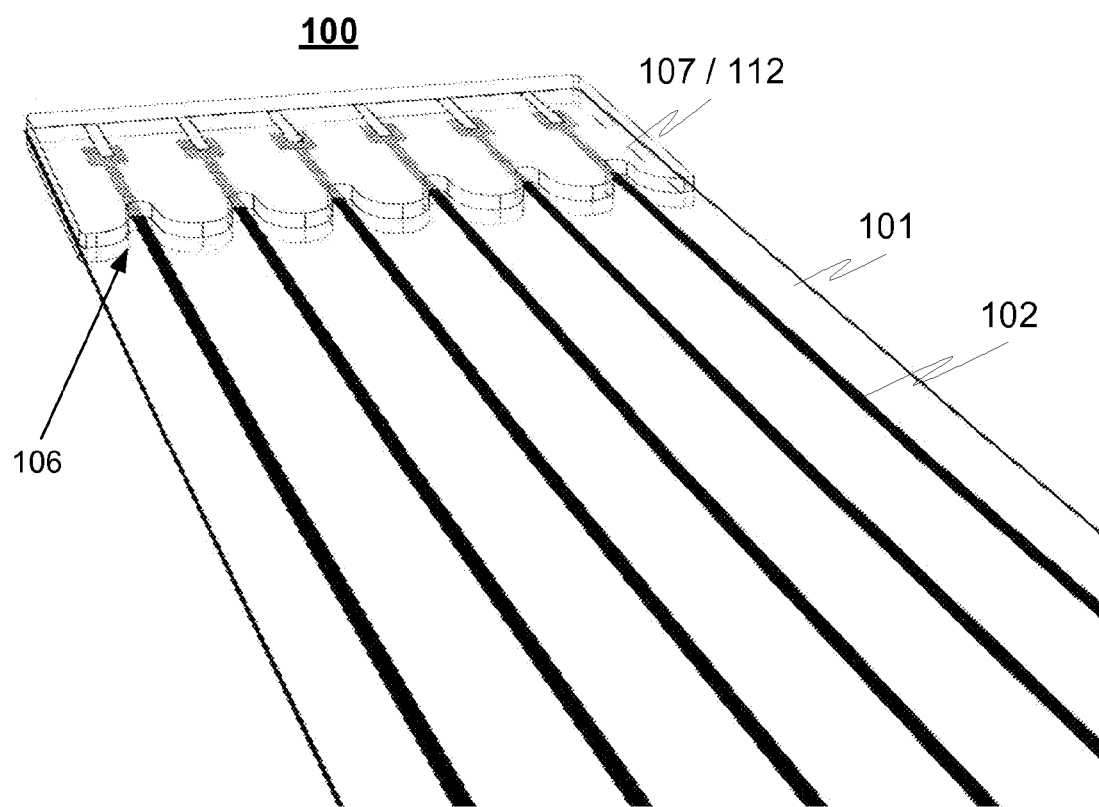

FIGS. 11A-B illustrate another way, where the interface region 105 with the inwardly curved portions 106 is provided by providing adhesive and component 107 (such as a plastic cover or the like) on the other side of the stretchable structure 101 than the conductive paths 102. The component can be implemented by using a compression fitting 112. FIGS. 11C-D illustrate still another way, where the interface region 105 with the inwardly curved portions 106 is implemented by a compression fitting 112, which can also function as the component 107, where the first compression fitting 112A is provided upside of the stretchable structure 101 and the second compression fitting 112B is provided underside of the stretchable structure 101 so to form the compression fitting 112 and thereby the interface region 105 with the inwardly curved portions 106. The final products 100 are shown in FIGS. 11B and 11D.

As an example, the final product 100 shown in FIG. 11B can function as e.g. a stretchable conductor strip to be used with regular compression connectors, such as flex circuit connectors. In addition, the final product 100 shown in FIG. 11D can function as e.g. a compression connector device, such as a flex circuit connector, which can be used to couple stretchable structure 101 with conductive paths 102 to a more rigid component 107.

Figure 12A:
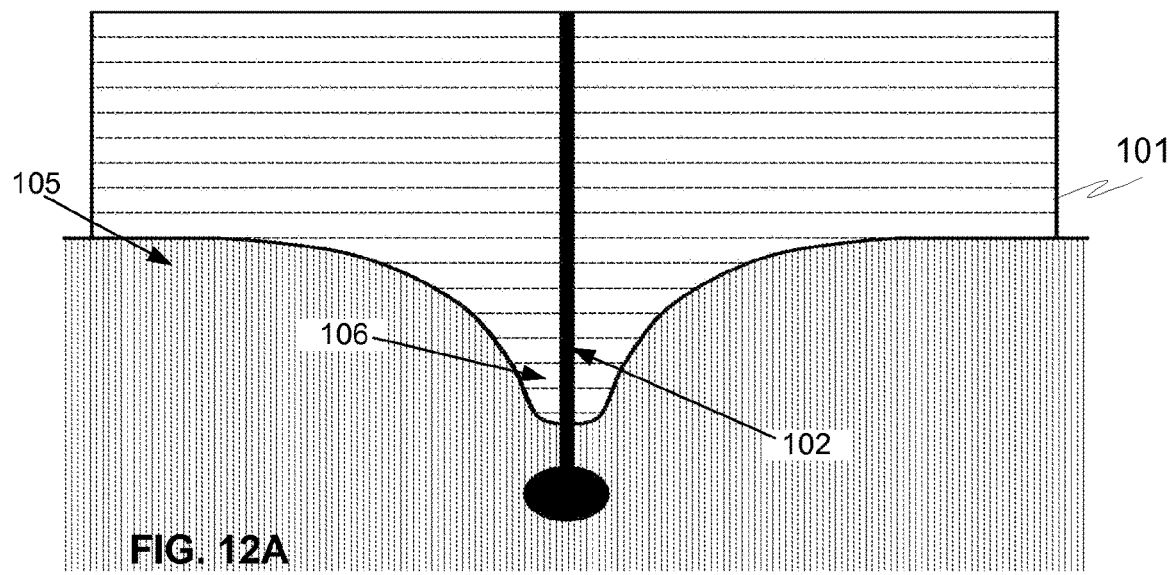
Figure 12B:
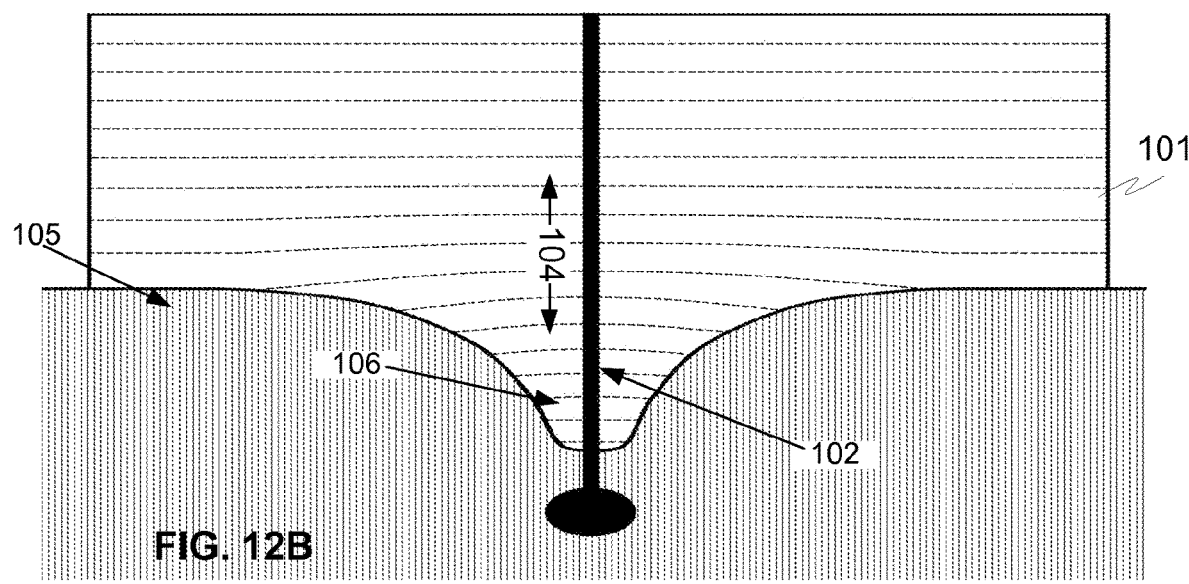
Figure 13A:
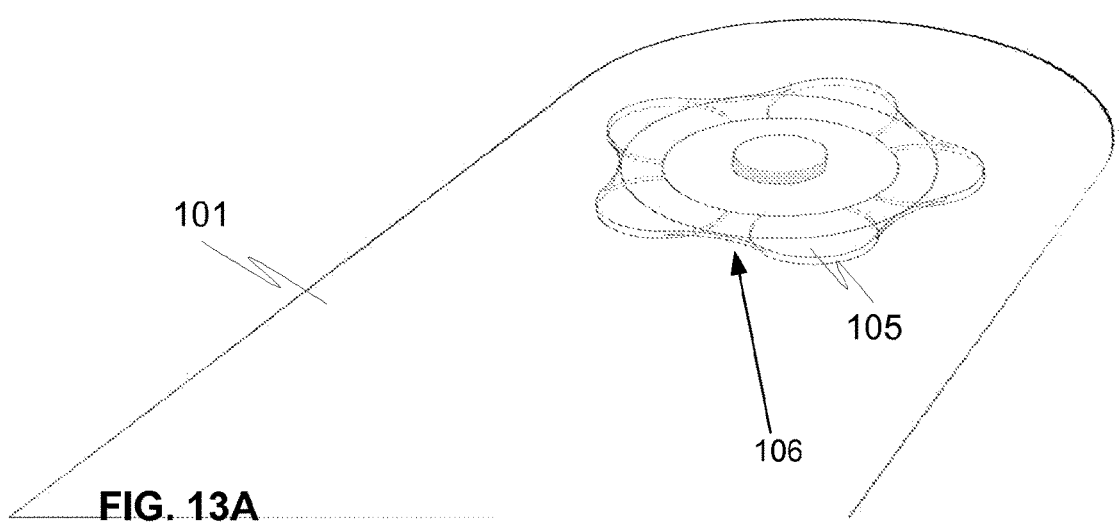
Figure 13B:
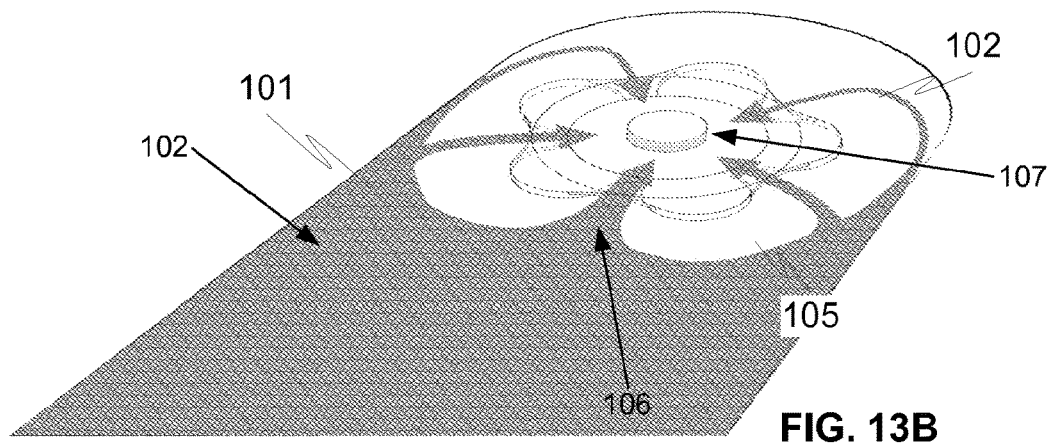
Figure 13C:
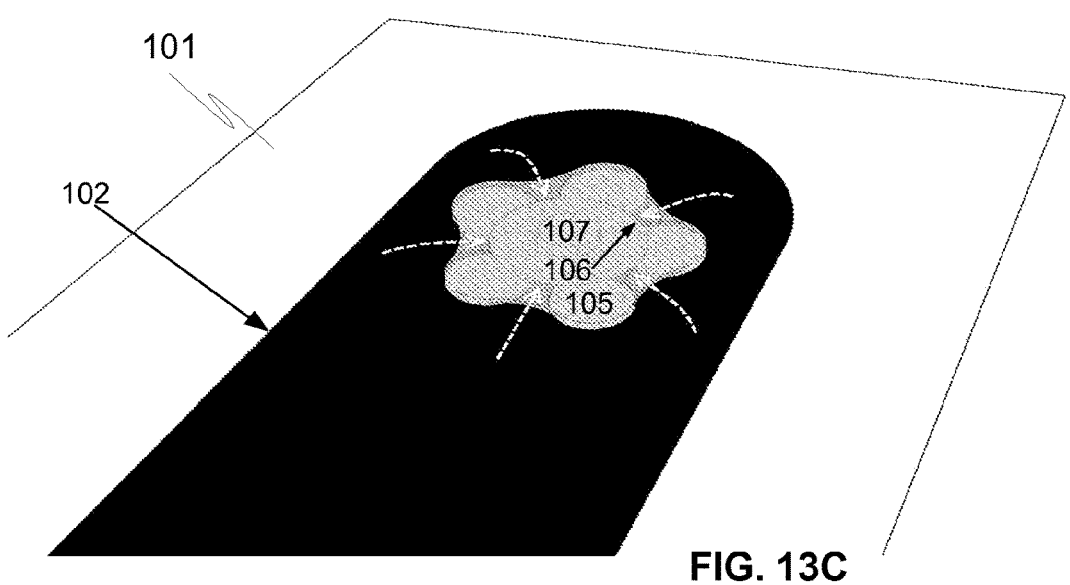
Figure 13D:
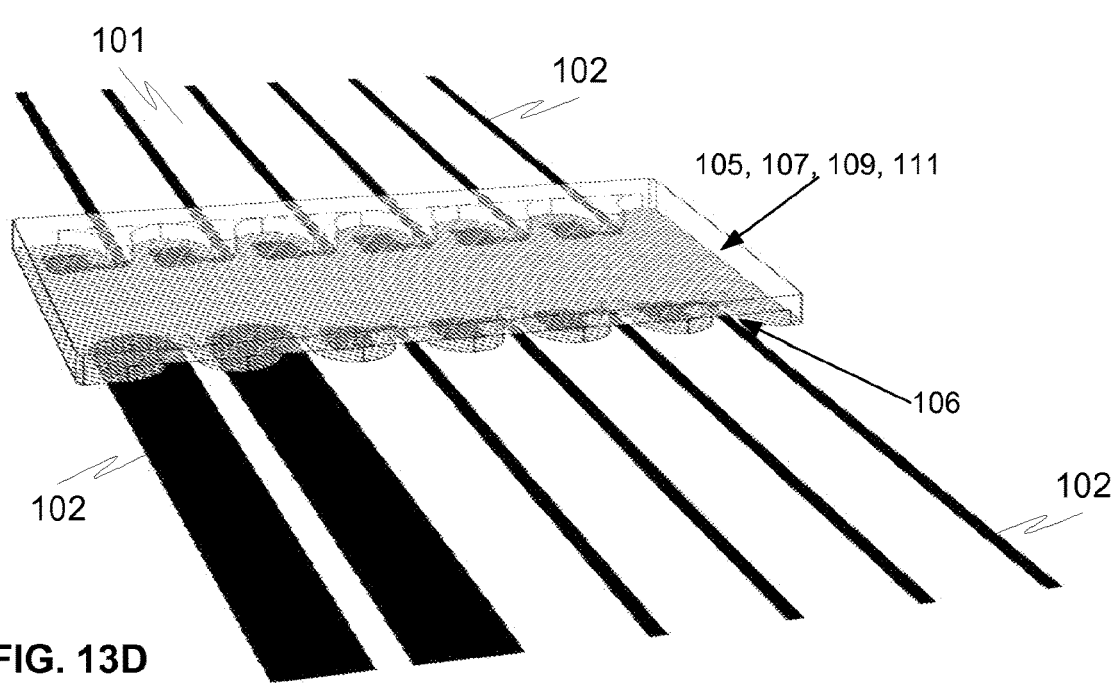

FIGS. 12A-B illustrate a principle of the stretchable structure 101 with the interface region 105 and inwardly curved portion 106, when the stretchable structure 101 is stretched. The interface region 105 is advantageously more rigid area or portion on or in the stretchable structure 101 than the stretchable structure as such. As can be seen in FIGS. 12A-B the inwardly curved portions 106 of the interface region 105 provided a "protective effect" to the area of the stretchable structure 101 surrounded by the interface region 105 so that when the stretchable structure 101 is stretched or twisted, the stretching effect does not influence inside the area 106 surrounded by the inwardly curved portions 106 or the peripheral of the interface region 105 as much and the stretching or twisting forces will smoothly decrease or fall away in the direction of the opening or "throat" of the inwardly curved portion 106 so when travelling towards the throat and the center area of the interface region 105. Most advantageously the stress forces directed to the conductive paths 102 will be decreased when travelling towards the end (inner) portion of the inwardly curved portion 106, and when travelling to the opposite direction from the end (inner) portion to the outer portion (opening) of the inwardly curved portion 106 the stress forces directed to the conductive paths 102 will be increased to the surrounding level prevailing in/on the stretchable structure 101 (outside the interface region 105). Thus the inwardly curved portions 106 according to the invention prevent or minimize or reduce any enormous or significant stretching of the stretchable structure 101 in the area 106 of the interface region 105 or in the area surrounded by said inwardly curved portion 106 thereby minimizing the strain or other unwanted stretching or twisting forces directed to the conductive paths 102 especially in the connection with more rigid component.

FIGS. 13A-13D illustrates still some embodiments of the invention where the inwardly curved portion 106 surrounds at least portion of the stretchable structure 101. The conductive path 102 is advantageously introduced to the component 107 along the stretchable structure 101 (either along the surface of the stretchable structure 101 or inside of the stretchable structure 101, as is described elsewhere in this document). The width of the stretchable conductive path 102 may be narrower at the point of the inwardly curved portion 106 than the width of the inwardly curved portion 106 (or "drain" of the inwardly curved portion 106), as is the case with FIGS. 2, 5A-6B and 9A-12B, whereupon the inwardly curved portion surrounds the whole width of the conductive path 102. The width of the stretchable conductive path 102 may also be wider at the point of the inwardly curved portion 106 than the width of the inwardly curved portion 106, as is depicted in FIGS. 13A-13D, whereupon the inwardly curved portion 106 surrounds only a portion of the width of the conductive path 102. Then another portion of the width of the conductive path may extend under the interface region 105 and "outside" of the inwardly curved portion 106. However it is to be noted that also in this embodiment at least portion of the stretchable conductive path 102 is surrounded by the inwardly curved portion 106. In particularly it is to be noted that the conductive path 102 may be as wide as the substrate or the stretchable structure 101 as such, or at least as wide or wider than the component or the whole 107.

It is to be noted that the stretchable structure according to the embodiments described in this document can be utilized in many applications and solutions, such as a part of clothing or garment.

The invention has been explained above with reference to the aforementioned embodiments, and several advantages of the invention have been demonstrated. It is clear that the invention is not only restricted to these embodiments, but comprises all possible embodiments within the spirit and scope of the inventive thought and the following patent claims. In addition the features recited in dependent claims are mutually freely combinable unless otherwise explicitly stated.

The invention claimed is:

1. A stretchable structure comprising or configured to receive a conductive path and an interface region so that said conductive path and the interface region are integral parts of the stretchable structure,
wherein:
said conductive path is a stretchable conductive path, and
the interface region comprises a peripheral line comprising at least one inwardly curved portion, where said inwardly curved portion of the peripheral line surrounds at least portion of said stretchable structure, said portion of said stretchable structure surrounded by said inwardly curved portion comprising at least portion of said stretchable conductive path, and wherein said interface region is arranged to receive said stretchable conductive path integrated to said stretchable structure via said inwardly curved portion of said peripheral line of said interface region, and
wherein stiffness of said stretchable structure inside said peripheral line of the interface region is greater than stiffness of said stretchable structure outside said peripheral line of said interface region.

2. The structure of claim 1, wherein said interface region is more rigid or the stretchability of which is less than one of the stretchable structure.

3. The structure of claim 1, wherein said inwardly curved portion is configured to prevent stretching of the stretchable structure in the area of said interface region.

4. The structure of claim 1, wherein the interface region with the inwardly curved portion has a form of a water lily, a snowflake or star like form with plurality of cusps, a shamrock, a daisy, or a butterfly form or a form of any letter of C, H, Y, X, U, O, L, M, N, D, F, E, K and V or characters comprising 3 or 8.

5. The structure of claim 1, wherein an opening angle of said inwardly curved portion is less than 180°.

6. The structure of claim 1, wherein the stretchable structure comprises also a component, where said component comprises said interface region with said inwardly curved portion.

7. The structure of claim 6, wherein the component is a non-stretchable component integrated into the stretchable structure.

8. The structure of claim 1, wherein the stretchable structure comprises also a component and the component comprises said interface region and wherein said inwardly curved portion is provided as a hollow between the component and the stretchable structure.

9. The structure of claim 1, wherein said interface region is a reinforced region provided on said stretchable structure so that the shape of said reinforced region forms said inwardly curved portion.

10. The structure of claim 1, wherein said interface region is made by printing, laminating, gluing or welding or screwing a reinforcement pattern on said stretchable structure, and thereby forming said interface region and thereby also introducing said inwardly curved portion.

11. The structure of claim 1, wherein said interface region is provided either inside said stretchable structure or on the surface of said stretchable structure either on the same side or on the opposite side as said conductive path or a component.

12. The structure of claim 1, wherein said interface region is arranged between at least two components so that both components are coupled with the same interface region.

13. The structure of claim 1, wherein the structure comprises a component, which is at least one of the following: an electronic, photonic, mechanical or an electro-mechanical component, electronic module, printed circuit board, sensor, electrode, integrated circuit, a seam like a zipper, an intersection, reinforcement portion, a snap fastener element, device or a component attachment.

14. The structure of claim 1, wherein the conductive path comprises a stretchable and conductive ink, a stretchable and conductive paste, a stretchable and conductive polymer film, a stretchable and conductive fabric or textile or meander or wavy shaped carbon, gold, copper, silver, steel or aluminum.

15. The structure of claim 1, wherein the stretchable structure comprises a polymer film, rubber, silicone elastomer, stretchable fabric or a textile or a composite structure comprising the fabric or textile, a nonwoven fabric or a paper.

16. The structure of claim 1, wherein said inwardly curved portion is configured to minimize stretching of the stretchable structure in the area surrounded by said inwardly curved portion.

17. The structure of claim 1, wherein said inwardly curved portion is configured to minimize stretching of the stretchable structure in the area of said interface region.

18. The structure of claim 1, wherein said inwardly curved portion is configured to prevent stretching of the stretchable structure in the area surrounded by said inwardly curved portion.

19. The structure of claim 1, wherein the stretchable structure is configured to receive also a component, where said component comprises said interface region with said inwardly curved portion.

20. The structure of claim 1, wherein the stretchable structure is configured to receive also a component and the component comprises said interface region and wherein said inwardly curved portion is provided as a hollow between the component and the stretchable structure.

21. The structure of claim 1, wherein said interface region is a reinforced region provided on said stretchable structure so that the shape of said reinforced region introduces said inwardly curved portion.

22. The structure of claim 1, wherein said interface region is a reinforced region provided in said stretchable structure so that the shape of said reinforced region forms said inwardly curved portion.

23. The structure of claim 1, wherein said interface region is a reinforced region provided in said stretchable structure so that the shape of said reinforced region introduces said inwardly curved portion.

24. The structure of claim 1, wherein said interface region is made by printing, laminating, gluing or welding or screwing a reinforcement pattern in said stretchable structure, and thereby forming said interface region and thereby also introducing said inwardly curved portion.

25. A method for manufacturing a stretchable structure, wherein the method comprises:

provided a stretchable conductive path and an interface region with a peripheral line to the stretchable structure as integral parts of the stretchable structure, and providing at least one inwardly curved portion to the peripheral line of the interface region to surround at least portion of said stretchable structure, where said portion of said stretchable structure surrounded by said inwardly curved portion comprises at least portion of said stretchable conductive path, and so that said conductive path is led into the interface region via said inwardly curved portion of said peripheral line of said interface region, wherein stiffness of said stretchable structure inside said peripheral line of the interface region is greater than stiffness of said stretchable structure outside said peripheral line of said interface region.

26. The method of claim 25, wherein said interface region is formed by hardening a portion of the stretchable structure to form said interface region with glue or other chemical or modifying the elasticity of the stretchable structure or by using heat.

27. The method of claim 25, wherein said interface region is a reinforced region provided in or on said stretchable structure, where the shape of said reinforced region is produced so that said inwardly curved portion essentially lacks said reinforcing material or feature thereby forming or introducing said inwardly curved portion.

28. The method of claim 25, wherein said interface region is made by printing, laminating, gluing or welding or etching or using suitable masks or screwing a reinforcement pattern or region in or on said stretchable structure, thereby forming said interface region and thereby also introducing said inwardly curved portion.

29. The method of claim 25, wherein said interface region is provided either inside of said stretchable structure or on the surface of said stretchable structure either on the same side or on the opposite side as said conductive path or a component to be provided to the stretchable structure.

\* \* \* \* \*